(12) United States Patent
Kumar et al.

(10) Patent No.: US 11,970,772 B2
(45) Date of Patent: Apr. 30, 2024

(54) DYNAMIC PRECURSOR DOSING FOR ATOMIC LAYER DEPOSITION

(71) Applicant: Lam Research Corporation, Fremont, CA (US)

(72) Inventors: Purushottam Kumar, Hillsboro, OR (US); Adrien LaVoie, Newberg, OR (US); Jun Qian, Sherwood, OR (US); Hu Kang, Tualatin, OR (US); Ishtak Karim, San Jose, CA (US); Fung Suong Ou, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/451,534

(22) Filed: Oct. 20, 2021

(65) Prior Publication Data

US 2022/0033967 A1 Feb. 3, 2022

Related U.S. Application Data

(60) Division of application No. 16/137,329, filed on Sep. 20, 2018, which is a continuation of application No.
(Continued)

(51) Int. Cl.
*C23C 16/455* (2006.01)
*C23C 16/52* (2006.01)
(Continued)

(52) U.S. Cl.
CPC .. *C23C 16/45527* (2013.01); *C23C 16/45561* (2013.01); *C23C 16/52* (2013.01);
(Continued)

(58) Field of Classification Search
CPC ........ C23C 16/45527; C23C 16/45561; C23C 16/52; H01L 21/0228; H01L 21/0262; H01L 21/28556
See application file for complete search history.

(56) References Cited

U.S. PATENT DOCUMENTS 3,669,312 A   6/1972   Kuckens et al.
5,465,766 A   11/1995  Siegele et al.
(Continued)

FOREIGN PATENT DOCUMENTS

CN       1501053 A      6/2004
CN    100438960 C     12/2008
(Continued)

OTHER PUBLICATIONS

Chinese First Office Action dated May 28, 2018 issued in Application No. CN 201610345105.X.
(Continued)

*Primary Examiner* — Peter Bradford
(74) *Attorney, Agent, or Firm* — Weaver Austin Villeneuve & Sampson LLP

(57) ABSTRACT

Methods and apparatuses for controlling precursor flow in a semiconductor processing tool are disclosed. A method may include flowing gas through a gas line, opening an ampoule valve(s), before a dose step, to start a flow of precursor from the ampoule to a process chamber through the gas line, closing the ampoule valve(s) to stop the precursor from flowing out of the ampoule, opening a process chamber valve, at the beginning of the dose step, to allow the flow of precursor to enter the process chamber, and closing the process chamber valve, at the end of the dose step, to stop the flow of precursor from entering the process chamber. A controller may include at least one memory and at least one processor and the at least one memory may store instructions for controlling the at least one processor to control precursor flow in a semiconductor processing tool.

10 Claims, 14 Drawing Sheets

Related U.S. Application Data

14/929,073, filed on Oct. 30, 2015, now Pat. No. 10,094,018, which is a continuation-in-part of application No. 14/516,452, filed on Oct. 16, 2014, now abandoned.

(60) Provisional application No. 62/236,780, filed on Oct. 2, 2015, provisional application No. 62/040,974, filed on Aug. 22, 2014.

(51) Int. Cl.
*H01L 21/02* (2006.01)
*H01L 21/285* (2006.01)

(52) U.S. Cl.
CPC ...... *H01L 21/0228* (2013.01); *H01L 21/0262* (2013.01); *H01L 21/28556* (2013.01)

(56) References Cited

U.S. PATENT DOCUMENTS

| | | | |
|---|---|---|---|
| 6,007,675 A | 12/1999 | Toshima | |
| 6,015,066 A | 1/2000 | Kimura et al. | |
| 6,217,657 B1 | 4/2001 | Kiba et al. | |
| 6,277,201 B1 | 8/2001 | Nishikawa | |
| 7,775,508 B2 | 8/2010 | Choi et al. | |
| 10,094,018 B2 | 10/2018 | Kumar et al. | |
| 11,072,860 B2 | 7/2021 | Nguyen et al. | |
| 11,180,850 B2 | 11/2021 | Kumar et al. | |
| 2005/0095859 A1 | 5/2005 | Chen et al. | |
| 2005/0173016 A1 | 8/2005 | Ludwig | |
| 2006/0121192 A1 | 6/2006 | Jurcik et al. | |
| 2006/0222768 A1 | 10/2006 | Faguet | |
| 2007/0235085 A1* | 10/2007 | Nakashima | C23C 16/4408 137/240 |
| 2008/0044573 A1 | 2/2008 | Chen et al. | |
| 2008/0149031 A1 | 6/2008 | Chu et al. | |
| 2008/0168946 A1 | 7/2008 | Nam et al. | |
| 2009/0183549 A1 | 7/2009 | Monkowski et al. | |
| 2009/0205563 A1 | 8/2009 | Arena et al. | |
| 2009/0211525 A1 | 8/2009 | Sarigiannis et al. | |
| 2009/0223451 A1 | 9/2009 | Kruger et al. | |
| 2009/0255466 A1 | 10/2009 | Peck | |
| 2010/0305884 A1 | 12/2010 | Yudovsky et al. | |
| 2011/0256726 A1 | 10/2011 | LaVoie et al. | |
| 2012/0216712 A1 | 8/2012 | Paranjpe et al. | |
| 2013/0019960 A1 | 1/2013 | Choi et al. | |
| 2013/0168864 A1* | 7/2013 | Lee | C23C 16/45525 438/654 |
| 2013/0171834 A1 | 7/2013 | Haverkamp et al. | |
| 2013/0196078 A1 | 8/2013 | Yudovsky et al. | |
| 2013/0210241 A1 | 8/2013 | LaVoie et al. | |
| 2014/0209562 A1 | 7/2014 | LaVoie et al. | |
| 2014/0248772 A1 | 9/2014 | Ma et al. | |
| 2015/0275367 A1 | 10/2015 | Moroi et al. | |
| 2015/0299858 A1 | 10/2015 | Yudovsky et al. | |
| 2016/0052651 A1 | 2/2016 | Nguyen et al. | |
| 2016/0052655 A1 | 2/2016 | Nguyen et al. | |
| 2016/0079057 A1 | 3/2016 | Varadarajan et al. | |
| 2016/0351401 A1 | 12/2016 | Ba et al. | |
| 2017/0096735 A1 | 4/2017 | Kumar et al. | |
| 2017/0362705 A9 | 12/2017 | Kumar et al. | |
| 2019/0024233 A1 | 1/2019 | Kumar et al. | |
| 2021/0324521 A1 | 10/2021 | Nguyen et al. | |

FOREIGN PATENT DOCUMENTS

| | | |
|---|---|---|
| CN | 101415977 A | 4/2009 |
| CN | 101514446 A | 8/2009 |
| CN | 102272351 A | 12/2011 |
| CN | 102348829 A | 2/2012 |
| CN | 1934287 B | 6/2012 |
| CN | 103041954 A | 4/2013 |
| CN | 103635990 A | 3/2014 |
| CN | 103688339 A | 3/2014 |
| JP | S63136614 A | 6/1988 |
| JP | H065985 A | 1/1994 |
| JP | H07150359 A | 6/1995 |
| JP | 2004031782 A | 1/2004 |
| JP | 2005056918 A | 3/2005 |
| JP | 2006052424 A | 2/2006 |
| JP | 2006114803 A | 4/2006 |
| JP | 2008172246 A | 7/2008 |
| JP | 2009016799 A | 1/2009 |
| JP | 2009215635 A | 9/2009 |
| JP | 2009532579 A | 9/2009 |
| JP | 2009544842 A | 12/2009 |
| JP | 2012515842 A | 7/2012 |
| JP | 2015512144 A | 4/2015 |
| TW | 200716778 A | 5/2007 |
| TW | 201144475 A | 12/2011 |
| WO | WO-2004010463 A2 | 1/2004 |
| WO | WO-2007115000 A2 | 10/2007 |
| WO | WO-2009004117 A1 | 1/2009 |
| WO | WO-2010083510 A1 | 7/2010 |

OTHER PUBLICATIONS

Chinese First Office Action dated Oct. 19, 2017 issued in Application No. CN 201510523984.6.
Chinese First Office Action dated Sep. 27, 2019 issued in Application No. CN 201610865153.1.
Chinese Second Office Action dated Jan. 28, 2019 issued in Application No. CN 201610345105.X.
Chinese Third Office Action dated Aug. 2, 2019 issued in Application No. CN 201610345105.X.
Japanese Decision of Grant dated Nov. 4, 2020 issued in Application No. JP 2016-192428.
Japanese First Office Action dated Jun. 24, 2019 issued in Application No. JP 2015-162483.
Japanese First Office Action dated May 26, 2020 issued in Application No. JP 2016-096649.
Japanese Second Office Action dated May 12, 2020 issued in Application No. JP 2015-162483.
KR Office Action dated Aug. 20, 2021, in application No. KR1020150117794.
Taiwanese First Office Action dated Apr. 2, 2019 issued in Application No. TW 104127252.
Taiwanese First Office Action dated Nov. 28, 2019 issued in Application No. TW 105115410.
Taiwanese First Office Action dated Sep. 2, 2020 issued in Application No. TW 105131453.
U.S. Corrected Notice of Allowance dated Oct. 6, 2020 issued in U.S. Appl. No. 14/720,595.
U.S. Examiner's Answer, dated May 24, 2019 issued in U.S. Appl. No. 14/720,595.
U.S. Final Office Action, dated Feb. 2, 2021, issued in U.S. Appl. No. 16/137,329.
U.S. Final Office Action, dated Jan. 5, 2018, issued in U.S. Appl. No. 14/516,452.
U.S. Final Office Action, dated May 18, 2018, issued in U.S. Appl. No. 14/720,595.
U.S. Notice of Allowance, dated Jul. 21, 2021, issued in U.S. Appl. No. 16/137,329.
U.S. Notice of Allowance, dated Jun. 8, 2018, issued in U.S. Appl. No. 14/929,073.
U.S. Notice of Allowance dated Mar. 19, 2021 issued in U.S. Appl. No. 14/720,595.
U.S. Notice of Allowance dated Oct. 2, 2020 issued in U.S. Appl. No. 14/720,595.
U.S. Office Action, dated Feb. 17, 2017, issued in U.S. Appl. No. 14/929,073.
U.S. Office Action, dated Jun. 14, 2018, issued in U.S. Appl. No. 14/516,452.
U.S. Office Action, dated Jun. 30, 2017, issued in U.S. Appl. No. 14/516,452.
U.S. Office Action, dated Nov. 16, 2018, issued in U.S. Appl. No. 16/137,329.

(56) References Cited

OTHER PUBLICATIONS

U.S. Office Action, dated Sep. 29, 2017, issued in U.S. Appl. No. 14/929,073.
U.S. Office Action, dated Sep. 7, 2017, issued in U.S. Appl. No. 14/720,595.
KR Office Action dated Apr. 1, 2022, in application No. KR1020150117794 with English translation.
U.S. Restriction Requirement dated Aug. 25, 2022 in U.S. Appl. No. 17/304,540.
U.S. Non Final Office Action dated Feb. 2, 2023 in U.S. Appl. No. 17/304,540.
CN Office Action dated Mar. 17, 2023, in Application No. CN202010098763.X with English translation.
KR Office Action dated Jun. 1, 2023, in Application No. KR10-2016-0061379 with English translation.

* cited by examiner

| Process | Dose Time (s) | Amp Open Time (s/cyc) | DepR (A/cyc) | NU% (R/2) | Chemical Usage (g/wfr) |
|---|---|---|---|---|---|
| Typical Process | 0.15 | 0.3 | 1.430 | 0.68 | 0.323 |
| New Process | 0.15 | 0.2 | 1.440 | 0.58 | 0.225 |

Figure 13

DYNAMIC PRECURSOR DOSING FOR ATOMIC LAYER DEPOSITION

CROSS-REFERENCE TO RELATED APPLICATIONS

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Some semiconductor manufacturing processes create a film on a semiconductor wafer by flowing a precursor onto the wafer and then activating a reaction of the substrate surface, usually with a plasma and/or second precursor. In one such process, atomic layer deposition ("ALD"), one or more vaporized precursors are flowed from an ampoule onto a semiconductor wafer as part of one or more "dose" steps during an ALD cycle. In some traditional semiconductor processing tools, some ways in which precursor is delivered to the processing chamber leads to precursor waste.

BRIEF DESCRIPTION OF THE DRAWINGS

FIG. 13 depicts some demonstrative data indicating that using the implementations discussed herein may, in at least some circumstances, lead to a reduction of precursor usage.

SUMMARY

Figure 1:
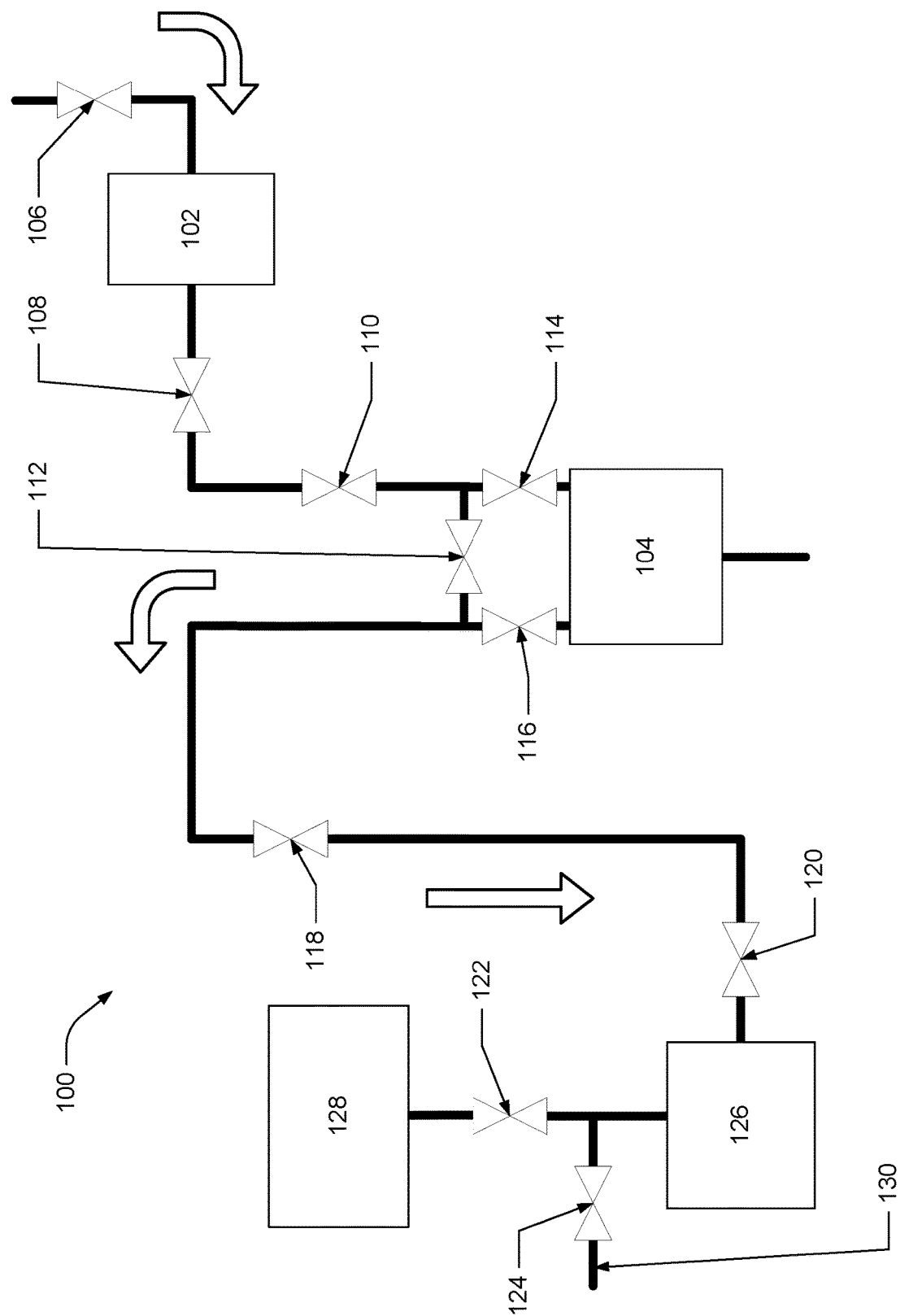
FIG. 1 depicts a schematic representation of an example precursor delivery system.

The systems, methods and devices of this disclosure each have several innovative aspects, no single one of which is solely responsible for the desirable attributes disclosed herein. Included among these aspects are at least the following implementations, although further implementations may be set forth in the detailed description or may be evident from the discussion provided herein.

In some implementations, a method for controlling precursor flow in a semiconductor processing tool is provided. The method may include: (a) flowing gas through a gas line, (b) opening one or more valves of an ampoule, before a dose step, to start a flow of precursor from the ampoule to a process chamber through the gas line, (c) closing the one or more valves of an ampoule to stop the precursor from flowing out of the ampoule, (d) opening a process chamber valve, at the beginning of the dose step, to allow the flow of precursor to enter the process chamber, and (e) closing the process chamber valve, at the end of the dose step, to stop the flow of precursor from entering the process chamber.

In some further implementations, opening one or more valves of an ampoule in (b) may occur before the dose step by an amount of time that may be substantially equal to a line charge time, where the line charge time is the time required for precursor to flow from the ampoule to the process chamber.

In some further implementations, closing the one or more valves of an ampoule in (c) may occur before the closing of the process chamber valve in (e) by an amount of time that may be substantially equal to a line charge time, where the line charge time is the time required for precursor to flow from the ampoule to the process chamber.

In some further implementations, opening a process chamber valve in (d) may occur after opening the valves of the ampoule in (b) by an amount of time that may be substantially equal to a line charge time, where the line charge time is the time required for precursor to flow from the ampoule to the process chamber.

In some further implementations, closing the process chamber valve in (e) may occur after closing the one or more valves of ampoule in (c) by an amount of time that may be substantially equal to a line charge time, where the line charge time is the time required for precursor to flow from the ampoule to the process chamber.

In some further implementations, closing the one or more flow valves of the ampoule in (c) may occur after opening the flow valves of the ampoule in (b) by an amount of time that may be substantially equal to an adsorption time.

In some further implementations, closing the process chamber valve in (e) may occur after opening the process chamber valve in (d) by an amount of time that may be substantially equal to the adsorption time.

In some such implementations, opening one or more valves of an ampoule in (b) may occur before the start of the dose step by an amount of time that may be substantially equal to a line charge time, where the line charge time is the time required for precursor to flow from the ampoule to the process chamber, closing the one or more flow valves of the ampoule in (c) may occur after opening the flow valves of the ampoule in (b) by an amount of time that may be substantially equal to an adsorption time, opening a process chamber valve in (d) may occur after opening the valves of the ampoule in (b) by an amount of time that may be substantially equal to the line charge time, and closing the process chamber valve in (e) may occur after opening the process chamber valve in (d) by an amount of time that may be substantially equal to the adsorption time.

In some further such implementations, the adsorption time may be a time less than the line charge time, a time greater than the line charge time, or a time equal to the line charge time.

In some further implementations, the one or more valves of the ampoule may be opened before the dose step to cause the precursor to reach the process chamber at the start of the dose step.

In some further implementations, the one or more valves of the ampoule may be opened before the dose step to cause the precursor to at least partially fill the gas line at the start of the dose step.

In some further implementations, the one or more valves of the ampoule may be closed before the end of the dose step to cause substantially no precursor to remain in the gas line at the end of the dose step.

In some further implementations, the one or more valves of the ampoule may be closed after an amount of precursor is in the gas line to achieve a desired adsorption onto a wafer.

In some further implementations, the valve of the process chamber may be closed after a desired adsorption onto a wafer has occurred.

In some further implementations, the valve of the process chamber may be closed when substantially no precursor remains in the gas line.

In some further implementations, the method may further include determining a line charge time, where the line charge time is the time required for precursor to flow from the ampoule to the process chamber.

In some embodiments, a controller for a semiconductor processing tool that includes a precursor delivery system may be provided. The controller may include at least one memory and at least one processor that may be communicatively connected with the at least one memory and configured to be communicatively connected with the semiconductor processing tool and the precursor delivery system. The at least one memory may store computer-executable instructions for controlling the at least one processor to: cause a flow of gas through a gas line, open one or more valves of an ampoule, before a dose step, to start a flow of precursor from the ampoule to a process chamber through the gas line, close the one or more valves of an ampoule to stop the precursor from flowing out of the ampoule, open a process chamber valve, at the beginning of the dose step, to allow the flow of precursor to enter the process chamber, and close the process chamber valve, at the end of the dose step, to stop the flow of precursor from entering the process chamber.

In some embodiments, the memory may further store computer executable instructions for controlling the at least one processor to open the one or more valves of the ampoule before the dose step to cause the precursor to reach the process chamber at the start of the dose step.

In some embodiments, the memory may further store computer executable instructions for controlling the at least one processor to close the one or more valves of the ampoule before the dose step to cause substantially no precursor to remain in the gas line at the end of the dose step.

In some embodiments, the memory may further store computer executable instructions for controlling the at least one processor to close the one or more valves of the ampoule after an amount of precursor is in the gas line to achieve a desired adsorption onto a wafer.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

There are many concepts and implementations described and illustrated herein. While certain features, attributes and advantages of the implementations discussed herein have been described and illustrated, it should be understood that many others, as well as different and/or similar implementations, features, attributes and advantages of the present disclosure, are apparent from the description and illustrations. As such, the above implementations are merely exemplary. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description above because the description of the above implementations has been presented for the purposes of illustration and description.

The present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

Disclosed herein are methods and apparatuses for improving the precursor delivery to a process chamber during some semiconductor fabrication processes which use film deposition on semiconductor substrates or wafers, some of which may involve multiple film deposition cycles, each producing a "discrete" film thickness. Atomic layer deposition ("ALD") is one such film deposition method, but any technique which puts down one or more thin layers of film, including those used in a repeating sequential manner and which may be viewed as involving multiple cycles of deposition, may apply to this disclosure. Some implementations of depositing a thin film on a semiconductor wafer may involve a cyclical process that may include two half reactions on the wafer surface. The first half reaction may include adsorption of one or more precursors on the surface of the wafer and the second half reaction may include the conversion of the adsorbed precursor(s) into a film or layer.

For example, ALD is a film forming technique which is well-suited to the deposition of conformal films due to the fact that a single cycle of ALD only deposits a single thin layer of material, the thickness being limited by the amount of one or more film precursor reactants which may adsorb onto the substrate surface (i.e., forming an adsorption-limited layer) prior to the film-forming chemical reaction itself. Multiple "ALD cycles" may then be used to build up a film of the desired thickness, and since each layer is thin and conformal, the resulting film substantially conforms to the shape of the underlying devices structure. In certain implementations, each ALD cycle includes the following steps (1) exposure of the substrate surface to a first precursor, (2) purge of the reaction chamber in which the substrate is located, (3), activation of a reaction of the substrate surface, typically with a plasma and/or a second precursor, and (4) purge of the reaction chamber in which the substrate is located. The first step listed herein may be referred to as a "dose step", the second step may be referred to as a "purge step", the third step may be referred to as a "RF step", and the fourth step may be referred to as a "RF purge step."

Some implementations of semiconductor processing that use a precursor may include hardware, and may implement methods, to deliver the precursor to the processing chamber. In certain implementations of semiconductor processing, a liquid precursor may need to be evaporated, i.e. vaporized, before being transported and/or deposited on a semiconductor wafer. The liquid precursor may be contained in an ampoule and a carrier gas, which may be an inert gas (such as argon), a non-inert gas (such as oxygen), or a non-inert gas mixture (such as oxygen and argon), may flow through the ampoule to carry evaporated precursor to a semiconductor processing chamber. Carrier gas may be either "pushed" (where gas is forced through the lines) or "pulled" (where gas is pulled through the lines, possibly via a vacuum) through the ampoule to carry the evaporated precursor. Throughout this disclosure, the term "precursor" may be used to describe precursor in both liquid and vapor states.

FIG. 1 depicts a schematic representation of an example precursor delivery system. As can be seen, the example precursor delivery system 100 includes a flow controller 102, an ampoule 104, a mixing assembly 126, and a process chamber 128 that are connected to a series of pipes and valves through which fluid, e.g. liquid and/or gas, may flow. In general, the direction of the fluid flow may be from the right of FIG. 1 towards the left of FIG. 1, with such general directions indicated by white three arrows. For instance, the flow controller 102 may be considered upstream from the ampoule 104 and from the mixing assembly 126. In FIG. 1, a gas line and/or pipe of the example precursor delivery system 100 is depicted as a line (which, for instance, may be solid, dashed, or dotted) while a valve is depicted as a "bowtie" (e.g., two opposing triangles); an open valve is not shaded, whereas a closed valve is shaded. All the valves in FIG. 1 are shown as open.

The flow controller 102 is connected downstream from valve 106 and upstream from the rest of the system. A push gas, or other fluid, may flow into the system and may flow through flow controller 102. In some implementations, the flow controller 102 controls the flow of the push gas or other fluid. Flow controller 102 is upstream from valve 108, which is upstream from valve 110, after which there is a junction between valve 112 and valve 114. The ampoule 104 includes two valves, valve 114 and valve 116, which may permit gas flow to enter and/or exit the ampoule 104. Valve 112 is a bypass valve which permits gas to bypass, or divert around, the ampoule 104, including when valves 114 and/or 116 may be closed. In between valve 116 and 112 is another junction point, after which, e.g. downstream, are valve 118 and valve 120, followed by the mixing assembly 126. Downstream from the mixing assembly 126 is a third junction which is between valve 122 and 124. Valve 124 flows to a foreline 130 which may not flow into the process chamber 128, while valve 122 permits flow to the process chamber 128. For purposes of this disclosure, the phrase "gas line section" and/or "gas line" may be used to describe one or more portions of the example precursor delivery system that may connect the ampoule 104 to the mixing assembly 126 and that may include valves 116, 118, and 120. In some embodiments, the gas line section may also be considered to include the line between the mixing assembly 126 and valve 122, and/or between valve 122 and the process chamber 128.

Figure 2:
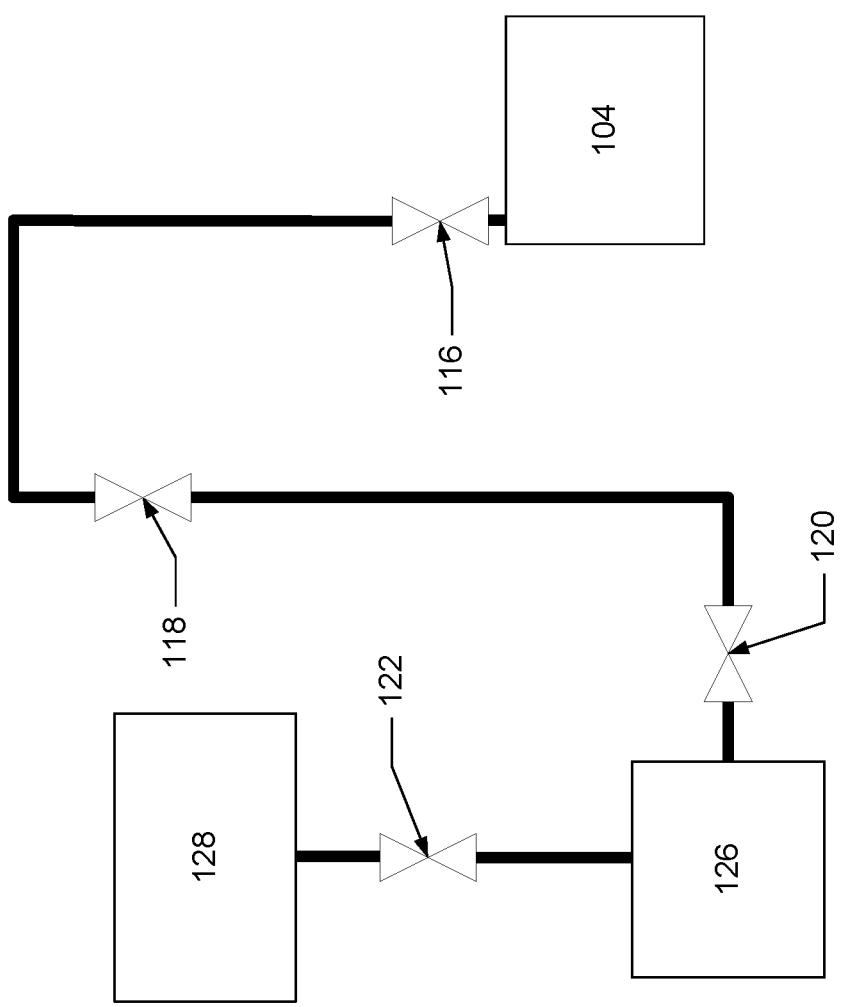
FIG. 2 depicts an example of the gas line section of the example precursor delivery system in FIG. 1.

FIG. 2 depicts an example gas line section of the example precursor delivery system in FIG. 1. As can be seen, this gas line section includes the gas line from the ampoule 104 to the process chamber 128.

For purposes of this disclosure, the phrase "ampoule valve 114/116" and/or "ampoule valve" may be used to describe valves 116 and 114, such that when the "ampoule valve 114/116" is open, valves 114 and 116 are open and precursor may flow out of the ampoule and into the gas line section, and that when the "ampoule valve 114/116" is closed, valves 116 and 114 are closed such that no precursor may flow into the gas line section. In some configurations, when the "ampoule valve 114/116" may be open, valve 112 may therefore be closed; similarly, when the "ampoule valve 114/116" may be closed, valve 112 may be open. Likewise, valve 122 may be considered the "process chamber valve 122" because it may allow or prevent flow into the process chamber 128, while valve 124 may be considered the "foreline valve 124" because it may allow or prevent flow into the foreline 130. Valve 112 may be considered the "bypass valve 112" since it allows or permits fluid to flow into the ampoule 104 or to divert or bypass the ampoule 104.

Some other precursor deliver systems may have some different elements and/or configurations, but the implementations discussed herein may still be applied to such other systems. A precursory delivery system, such as that depicted in FIG. 1, may be part of a semiconductor processing tool, and may be connected to one or more process chambers. For demonstrative purposes, the precursor delivery system discussed herein involves one process chamber, but in some implementations, it may involve more than one process chamber.

The precursor delivery system may be implemented in a number of methods in order to deliver precursor to the process chamber 128. In some implementations, the precursor may be caused to flow into the precursor delivery system when push gas, such as an inert gas like Argon or a non-inert gas like Oxygen, is caused to flow, for instance by the flow controller 102, through opened valves 108, 110, and 114 into the ampoule 104. In such a situation, valve 112 may be closed. The vaporized precursor in the ampoule 104 may be pushed by the push gas out of the ampoule 104 and through opened valves 116 and 118 into the mixing assembly 126. In some such situations, the precursor may be caused to flow through opened valve 122 into the process chamber 128, during which valves 112 and 124 may be closed.

The time that the vaporized precursor takes to flow from the ampoule 104 to the process chamber 128 may be considered the "line charge time". However, line charge time may also be considered the time that the precursor takes to flow from the ampoule 104 to another location that may be upstream from the process chamber 128, for instance at the process chamber valve 122. A charging of a gas line may be considered the process of loading precursor into the gas line, such that a partially charged gas line is a gas line that may contains some, but not all precursor while a fully charged gas line may contain substantially all precursor. The time that the wafer takes to adsorb a certain amount, or percentage, of the precursor may be considered the "adsorption time". This adsorption time may be the saturation time, less than the saturation time, or more than the saturation time. The saturation time is the time required to fully saturate the work piece surface, e.g. a wafer or substrate, with precursor. Saturation may be considered the point at which additional precursor cannot be adsorbed onto or otherwise physically and/or chemically associated with the work piece surface.

Some current general implementations of precursor delivery will now be discussed. In one current general implementation, during more than one step of an ALD cycle, the push gas may be caused to continuously flow, e.g. by the flow controller 102, into the ampoule 104 such that vaporized precursor is continuously flowing downstream from the ampoule 104, but this continuously flowing precursor is diverted away from the process chamber 128 during steps in which precursor is not desired to be delivered to the process chamber 128, and directed into the process chamber 128 when the precursor is required in the process chamber 128, e.g., during a dose step. For example, in steps in which the precursor is not to be delivered to the process chamber 128, e.g. during the RF step, valve 122 may be closed and valve 124 may be opened thereby diverting precursor to the foreline 130; conversely, when precursor is desired in the process chamber 128, valve 124 may be closed and valve 122 may be opened. However, such continuously flowing vaporized precursor presents a number of disadvantages including, but not limited to, significant precursor usage and/or precursor waste.

In some other current general implementations, the activation of the ampoule valve may be tied to, e.g. coupled with, and/or dependent upon the start and/or stop of a step in the process. For example, the ampoule valve 114/116 may open at the start of the dose step or the RF purge step, and the ampoule valve 114/116 may close at the end of the dose step. In some such implementations, the precursor flow from the ampoule 104 towards the process chamber 128 may start at the same time as the start of a process step, e.g. the RF purge step, and the precursor flow may be stopped at the end of the dose step. Such a method has a number of disadvantages including, but not limited to, precursor waste and/or additional time usage (which may slow wafer throughput).

For example, in some current implementations in which the precursor is caused to flow from the ampoule 104 to the process chamber 128 at the beginning of the dose step, the total dose step time includes at least the line charge time plus the adsorption time. Moreover, after the dose step, precursor may remain in the gas line section between the ampoule 104 and the process chamber 128, which may be referred to as "slug". This slug may be diverted away from the process chamber 128, i.e. "dumped", to foreline 130, because if slug is used in later wafer processing steps, condensation may occur in the gas line section, which may lead to unwanted wafer defects. Some of this example's disadvantages include, among other things, a long dose time which may reduce throughput (i.e. process efficiency and total process time) as well as precursor waste.

Another example involves the precursor starting to flow from the ampoule 104 to the process chamber 128 at the beginning of the RF purge step, which is before a dose step. In some such situations, in which the RF purge step takes less time than the line charge time, the RF purge step may be caused to be longer than is necessary in order to allow the precursor to reach the process chamber 128. This may adversely affect throughput, wafer uniformity, and may waste additional materials used during the RF purge step. In some other situations, in which the RF purge step takes more time than the line charge time, the precursor may reach the process chamber 128 before the end of the RF purge step which may require some precursor to be diverted away from the process chamber 128 and dumped, thereby wasting precursor. Additionally, as discussed above, after the dose step is complete, precursor may remain in the gas line between the ampoule and the process chamber 128 and may be dumped, thus wasting additional precursor.

In such current example implementations, as well as other current implementations not discussed herein, the precursor delivery systems are not configured to optimize line charge time and dose time while also reducing precursor usage. Such systems have significant disadvantages, including, but not limited to, adversely affecting line charge time, dose step time, throughput, and causing wafer defects.

The inventors of the present disclosure have developed new methods, implementations, apparatuses, and techniques to dynamically deliver and efficiently utilize the precursor while achieving low defectivity in semiconductor processing. In some implementations, the opening and closing of the ampoule valve 114/116 may be decoupled from occurring at the start and/or stop of a process step, as described above, such that the ampoule valve 114/116 may open and/or close independently of the start and stop of processing steps. In some such implementations, the operation of the ampoule valve 114/116 may be independent of the ALD steps in the process chamber. In some implementations, the precursor also may not flow continuously. As discussed in more detail below, in order to deliver the desired amount of precursor to the process chamber at the beginning of the dose step, the present implementations and techniques may adjust, among other factors, (A) the duration of the ampoule valve 114/116 opening and/or (B) the time at which the ampoule valve 114/116 opens before the dose step.

For example, using FIG. 1, the ampoule valve 114/116 may open at a specific time before the dose step in order to charge, or partially charge, the gas line section before the dose step such that the precursor arrives at the processing chamber 128 at the beginning of the dose step. The time at which the ampoule valve 114/116 may open before the dose step may be dependent upon, among other things, the hardware of the precursor delivery system and/or semiconductor processing tool; one or more process parameters such as, for example, push gas flow, ampoule temperature, and/or headspace pressure; vapor line charge time; and/or desired adsorption time. The ampoule valve 114/116 may remain open for a particular time in order to draw, i.e. load, the appropriate and/or desired amount of precursor from the ampoule 104 for the desired amount of wafer adsorption and/or the amount of precursor needed within the gas line section.

The ampoule valve 114/116 may also close after the appropriate and/or desired amount of precursor has flowed out of the ampoule 104. In some implementations, the desired amount of precursor may be enough for saturation of the wafer, for less adsorption than saturation, or more than may be necessary for a desired adsorption and/or saturation; this amount may be variable, may change from cycle to cycle, and/or may be controlled by a user. The dose step may end, e.g. process chamber valve 122 may close, after all or a major portion of the precursor has flowed to the process chamber 128 such that by the end of the dose step, the desired amount of adsorption has occurred and there is substantially no precursor remaining in the gas line section. In some such implementations, there may be a continuous push gas flow, e.g. a flow that may not stop during a cycle and/or may begin before the ampoule valve 114/116 opens and may stop after the process chamber valve 122 is closed.

In some of the new implementations, the valve timings may be related to the start and/or stop of certain deposition operations such as the start and stop of an ALD dose step. The time between opening the ampoule valve 114/116 and the start of a dose step may be equivalent to, or based on, a gas line charge time (which, as discussed above, may be the time required for gas to flow from the ampoule 104 to the entrance of the process chamber 128). Further, the ampoule valve 114/116 may remain open for a duration equivalent to, or based on, the time required to meet the process requirements for adsorbing precursor onto the work piece surface (which, as discussed above, may be the saturation time or a percentage of the saturation time).

Figure 3:
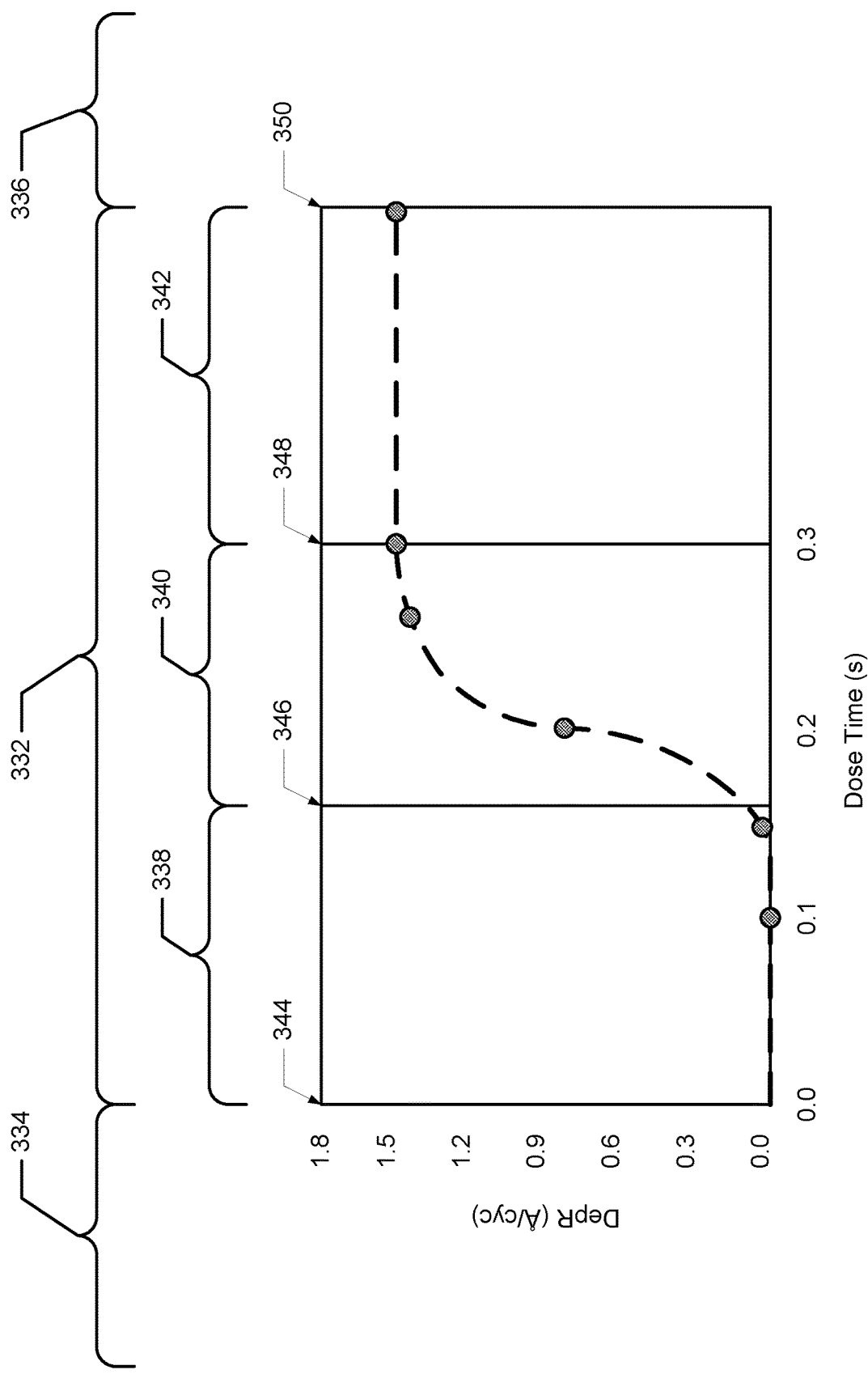
FIG. 3 depicts the graphical representation of an example experiment that may be used to determine line charge time.

As mentioned above, the time at which the ampoule valve 114/116 opens and/or the duration for which the ampoule valve 114/116 is opened may depend upon the adsorption time and/or the line charge time. The line charge time may be determined by a number of different methods. FIG. 3 depicts the graphical representation of an example experiment that may be used to determine line charge time. FIG. 3 includes, among other things, some of the parameters, data, and results of such example experiment. As can be seen, the entire dose step 332 is depicted, with the x-axis as the dose time in seconds, and the y-axis as the deposition rate. The RF Purge step 334 is shown on the left of FIG. 3 to indicate that such step may take place before the dose step 332, while the Purge step 336 is shown on the right of FIG. 3 to indicate that such step may take place after the dose step 332. In such an experiment, the deposition rate of a wafer was measured for varying durations of dose step 332 in order to determine the line charge time and the adsorption time (in this case, the saturation time was measured). The dose step 332 of FIG. 3 has three sections, the first being line charge time 338 which may occur between about point 344 and about point 346, the second being adsorption time 340 (which may be saturation time) which may occur between about point 346 and about point 348, and the third being post saturation 342 which may occur between about point 348 and 350.

In the experiment depicted by FIG. 3 and referring to the example precursor delivery system in FIG. 1, immediately before the beginning of the dose step 332, the ampoule valves 114/116 were closed, valves 106, 108, 110, 112, 118, 120, and 124 were open, and valve 122 was closed, such that no precursor was flowing from the ampoule 104, but push gas was flowing through the system and diverted around the ampoule 104 through valve 112. At time zero of the dose step 332, i.e. at point 344, the ampoule valve 114/116 was opened and valve 112 was closed to begin flowing precursor to the process chamber 128 from the ampoule 104. As can be seen in FIG. 3, the deposition rate remained at approximately zero until about 0.16 seconds, indicated by point 346, when deposition began, meaning that the precursor arrived in the process chamber 128 and began depositing precursor on the wafer, thus giving a line charge time 338 of approximately 0.16 s. The second section in the dose phase 332 in FIG. 3, adsorption time 340, depicts the time at which the wafer reached the desired adsorption, which here was saturation, after which no further material was adsorbed by the wafer, and occurred at approximately 0.3 seconds after the beginning of dose step 332, i.e. at point 348. Thus, the saturation time was about 0.15 s for this example. During the third section of the dose phase 332, post saturation 342, precursor flowed into the process chamber 128 but no further adsorption occurred.

In the example shown in FIG. 3, the line charge time (about 0.16 seconds) was approximately the same as the adsorption (e.g. saturation) time (about 0.15 seconds). Based on these findings the present inventors determined that in some situations, vapor in a completely, or substantially, charged line (e.g. precursor in the gas line section from about valve 116 to about the process chamber 128) may deliver all or most of the precursor that may be required for desired adsorption and/or saturation. However, in some other implementations that may use different process conditions, this may not hold true. Furthermore, the present inventors determined that line charge may be started accurately to avoid, or reduce, precursor waste, and that the precursor flow into the gas line section, e.g. from the ampoule 104, may be stopped, e.g. by closing the ampoule valve 114/116, before the end of the dose step such that the gas line section already charged with precursor may be used for the remaining dose step, and/or that the precursor flow may be decoupled from the ALD steps in the chamber.

In some implementations, a measurement step such as the above may be conducted in order to determine a line charge time and/or saturation/adsorption time for a cycle, step, or process. Such information may later be used in order to determine the timing and duration of the ampoule valve opening and closing, e.g., with respect to the dose step of an ALD process. In some implementations, this measurement may occur before, during, and/or after an ALD cycle and may be repeated throughout a cycle, step, and/or semiconductor manufacturing process.

Some example implementations demonstrating the timing of the ampoule valve's opening and closing in relation to the dose step and process chamber valves' opening and closing will now be discussed. As stated above, the time at which the ampoule valve opens and/or closes may depend upon the adsorption time and/or the line charge time. Three example situations are discussed which involve the adsorption time may be less than the line charge time, the adsorption time may be more than the line charge time, and the adsorption time may be substantially equal to the line charge time. In discussing these example implementations, the same example precursor delivery system of FIG. 1 is used. However, these example implementations are not limited to the precursor delivery system of FIG. 1; they may be applied to any precursor delivery system of any semiconductor processing tool. Furthermore, in such example implementations, push gas may be flowing continuously through the system.

Figure 4:
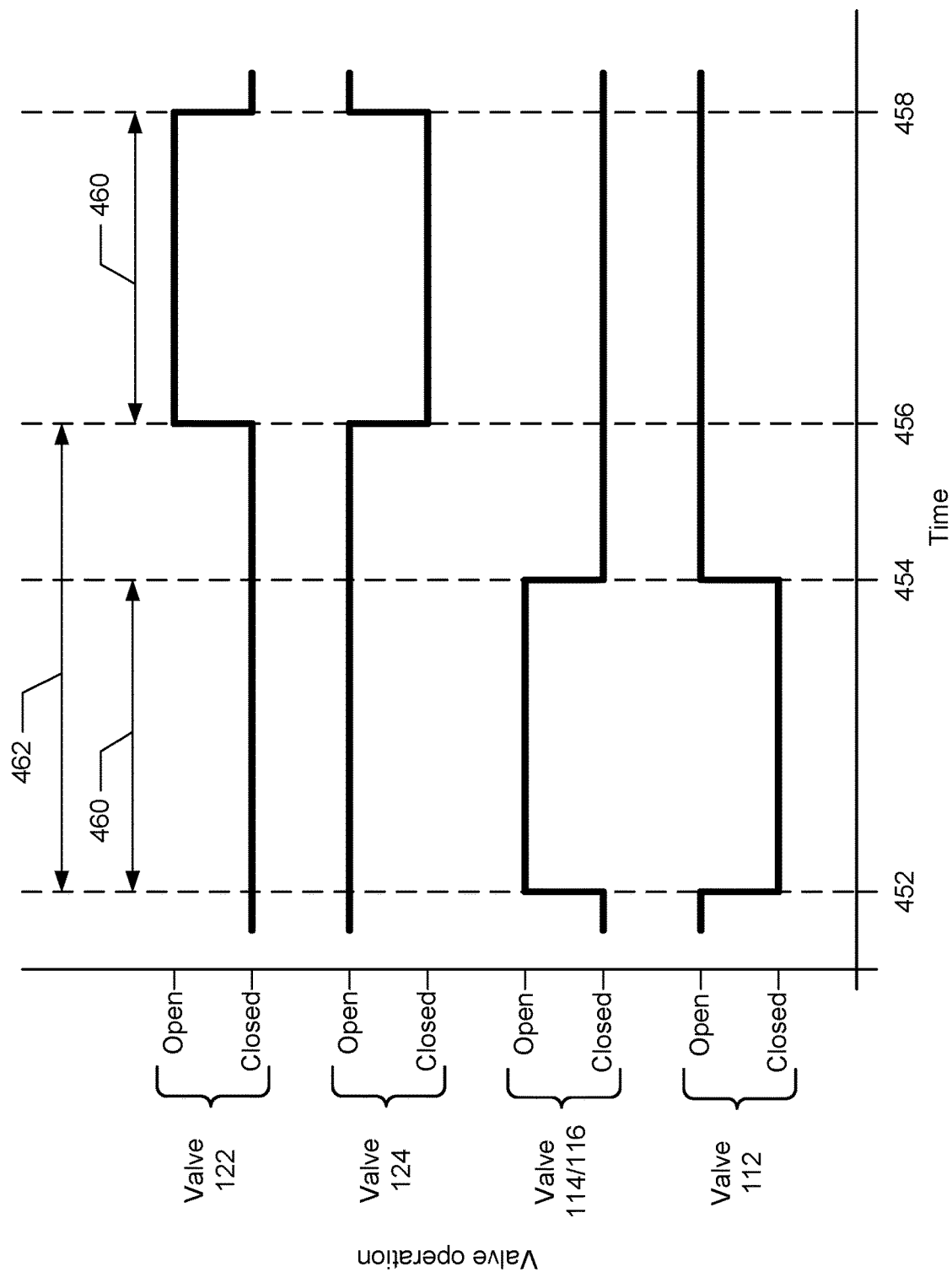
FIG. 4 depicts a graphical representation of valve operation and timing for the first example implementation of a precursory delivery system when the adsorption time may be less than the line charge time.

In a first example implementation, the adsorption time may be less than the line charge time. FIG. 4 depicts a graphical representation of valve operation and timing for the first example implementation of a precursory delivery system when the adsorption time may be less than the line charge time. In the chart depicted in FIG. 4, time is on the x-axis and progresses from left to right, but does not have specific units because the units may vary depending on numerous factors including, but not limited to, the process step, the precursor, push gas, and process conditions; the y-axis contains valve operation, i.e. either "open" or "closed" for four valves, which includes the process chamber valve 122, the foreline valve 124, the ampoule valve 114/116, and the bypass valve 112. As can be seen, before any precursor is loaded into the system, i.e. before a first time point 452, the process chamber valve 122 is closed, the foreline valve 124 is open, the ampoule valve 114/116 is closed, and the bypass valve is open, which may allow the push gas to flow from, among other items, the flow controller 102, through the bypass valve 112, not into the ampoule 104, into the mixing assembly 126, and through the foreline 130.

At about the first time point 452 in FIG. 4, the ampoule valve 114/116 opens and the bypass valve 112 closes, thereby allowing push gas to flow into the ampoule 104 and cause precursor to begin flowing into the system. In this example implementation, the ampoule valve 114/116 may open before the process chamber valve 122 opens and it may be open for a time period equal to, or substantially equal to, that of the adsorption time 460. The ampoule valve 114/116 may close at about a second time point 454 which may also be before the process chamber valve 122 opens. In FIG. 4, the gas line section may be loaded with precursor between about the first time point 452 and about the second time point 454, but in some such implementations like that depicted in FIG. 4, the gas line section between the ampoule 104 and the process chamber 128 may not be fully charged or loaded with precursor at the end of loading at about the second time point 454. This may allow the desired amount of precursor to be sent into the gas line section and/or into the process chamber 128.

Figure 5:
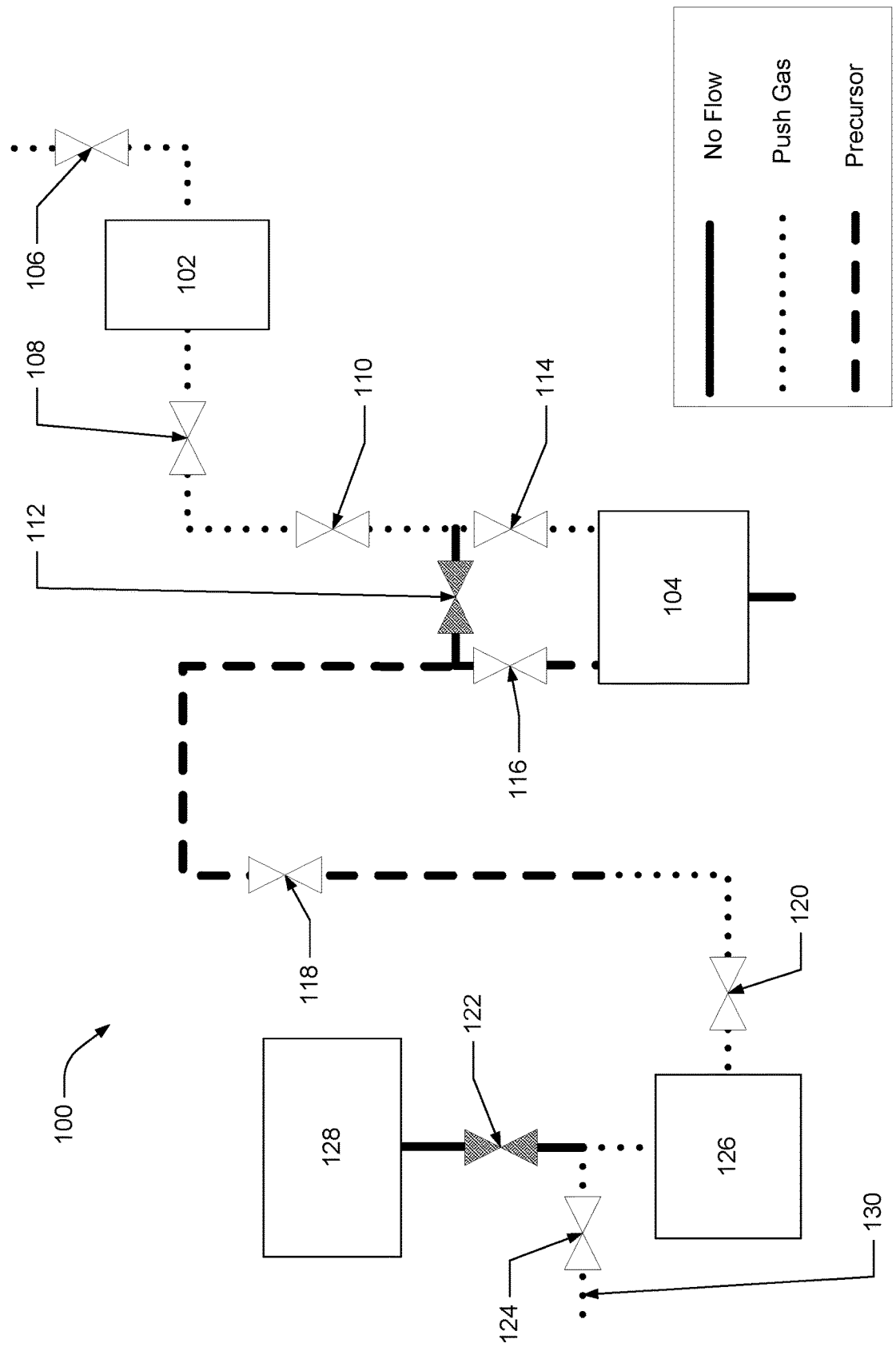
FIG. 5 depicts the precursor delivery system of the first example implementation at the end of precursor loading.

FIG. 5 depicts the precursor delivery system of the first example implementation at the end of precursor loading. In reference to the chart of FIG. 4, FIG. 5 shows the example precursor delivery system 100 immediately before about the second time point 454. In FIG. 5 (as well as FIGS. 6, 8, 9, 11, and 12), as indicated by the legend in the lower right corner, a solid line indicates no flow, a dotted line indicates push gas, and a dashed line indicates precursor. As can be seen in FIG. 5, the gas line section (e.g. from the junction between valves 114 and 116 to the junction of valves 122 and 124) contains both precursor and push gas. In this example implementation, the amount of precursor that may be loaded into the gas line section may not fully charge the gas line section, but may be sufficient for the desired adsorption or the desired process. FIG. 5 also shows that bypass valve 112 is closed thereby allowing the push gas to enter into the ampoule 104, and also shows process chamber valve 122 closed and foreline valve 124 open thus causing the push gas to divert to the foreline 130 and not into the process chamber 128.

Referring back to FIG. 4 at about the next time point, a third time point 456, the dose step begins. Between the end of loading at about the second time point 454 and the start of the dose step at about the third time point 456, the ampoule valve 114/116 may be closed, the bypass valve 112 may be open, the foreline valve 124 may be open and the process chamber valve 122 may be closed. In some example implementations, the dose step may begin after the beginning of the precursor loading, e.g. the first time point 452, by an amount of time equal, or substantially equal, to that of a line charge time 462. As stated previously, the line charge time 462 may be considered the time for the precursor to travel from the ampoule 104 to the process chamber 128. This timing may cause the precursor to reach the process chamber 128 at about the third time point 456, which may be the start of dosing, e.g. the dose step.

Figure 6:
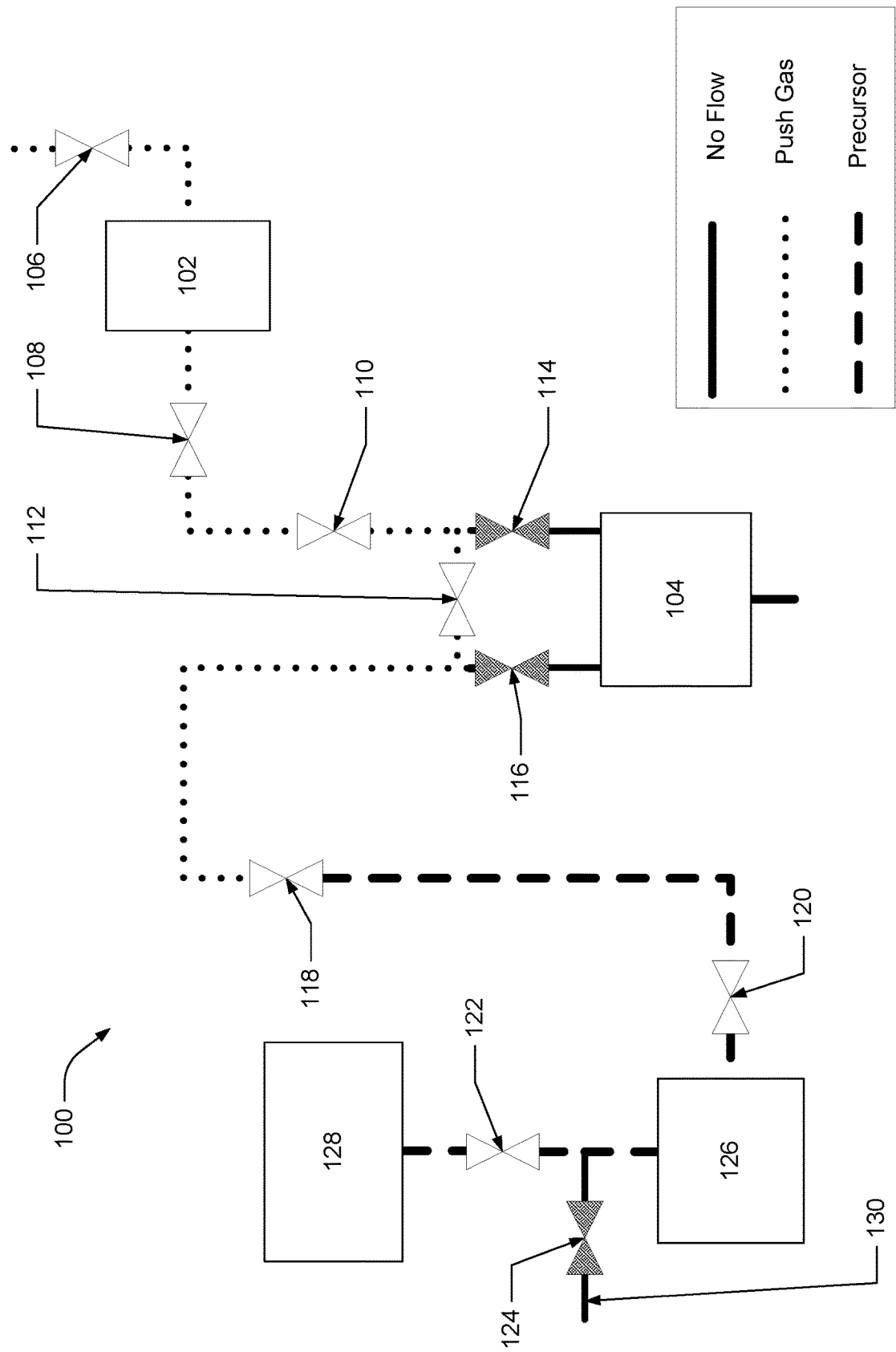
FIG. 6 depicts the precursor delivery system of the first example implementation at the beginning of the dose step.

The precursor delivery system at this third time point 456 may be seen in FIG. 6. FIG. 6 depicts the precursor delivery system of the first example implementation at the beginning of the dose step. As can be seen, the ampoule valve 114/116 is closed, the bypass valve 112 is open, the foreline valve 124 is closed, and the process chamber valve 122 is open, all of which enables the precursor in the gas line section to enter the process chamber 128.

Referring back to FIG. 4, the chamber valve 122 may be open for an amount of time that may permit the desired amount of precursor to enter the process chamber 128. This amount of time may be equal to, or substantially equal to, the adsorption time 460, which as depicted in FIG. 4, may be between about the third time point 456 and about a fourth time period 458. Once the process chamber valve 122 has been open for the desired amount of time, which may be the adsorption time 460, the process chamber valve 122 may close and the foreline valve 124 may open, as is depicted at about the fourth time point 458; this fourth time point 458 may be considered the end of the dose step. At such a time, in some embodiments, there may be little or no precursor remaining in the gas line section.

Figure 7:
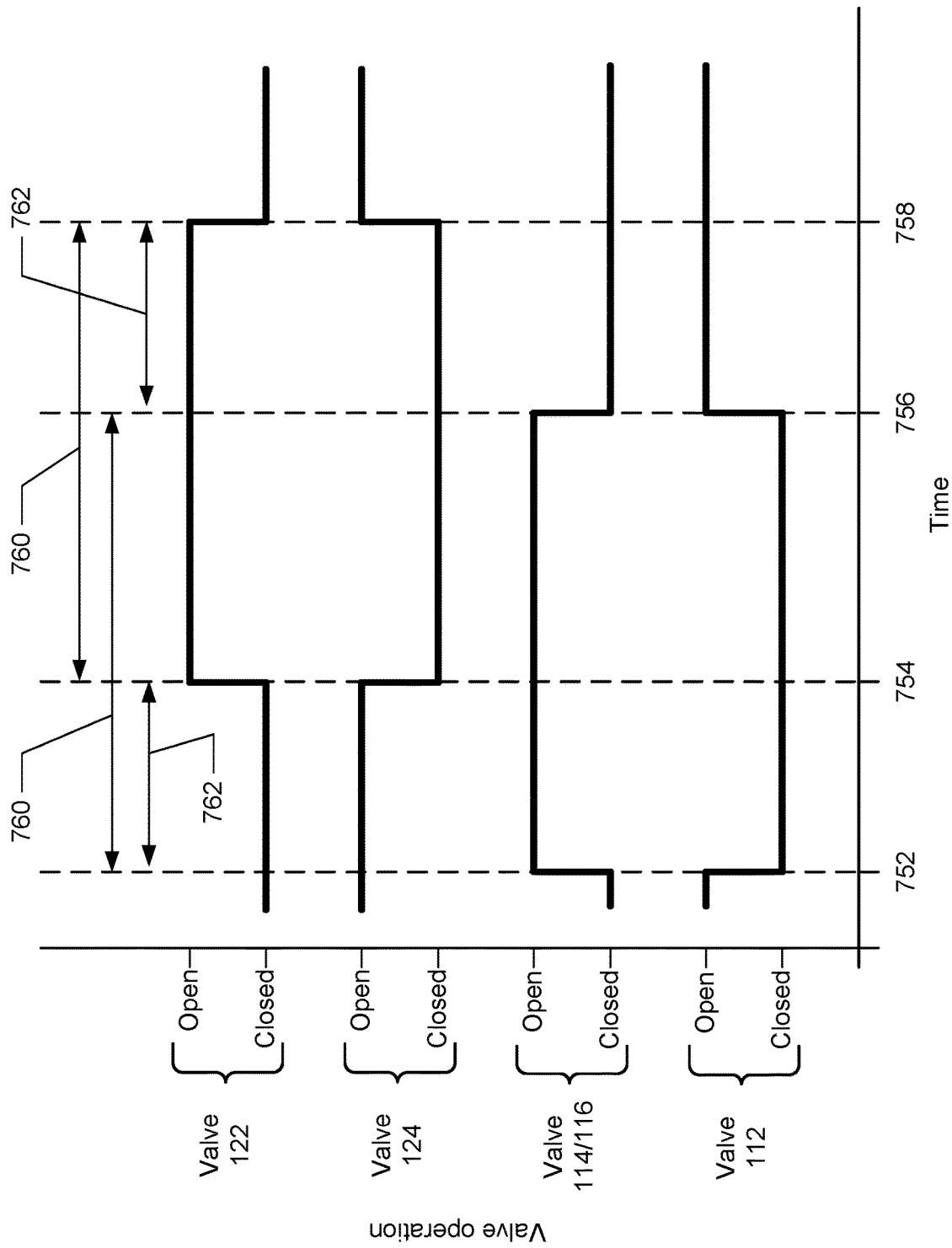
FIG. 7 depicts a graphical representation of valve operation and timing for the second example implementation of a precursory delivery system when the adsorption time may be greater than the line charge time.

In a second example implementation, the adsorption time may be greater than the line charge time. FIG. 7 depicts a graphical representation of valve operation and timing for the second example implementation of a precursory delivery system when the adsorption time may be greater than the line charge time. Similar to the chart in FIG. 4, in FIG. 7 time is on the x-axis and progresses from left to right, and the y-axis contains valve operation, i.e. either "open" or "closed" for the same four valves, which include the process chamber valve 122, the foreline valve 124, the ampoule valve 114/116, and the bypass valve 112. As can be seen, before any precursor is loaded into the system, i.e. before a first time point 752, the process chamber valve 122 is closed, the foreline valve 124 is open, the ampoule valve 114/116 is closed, and the bypass valve is open, which may allow the push gas to flow from, among other items, the flow controller 102, through the bypass valve 112 and not into the ampoule 104, into the mixing assembly 126, and through the foreline 130.

At about the first time point 752 in FIG. 7, the ampoule valve 114/116 may open and the bypass valve 112 may close, thereby allowing push gas to flow into the ampoule 104 and cause precursor to begin flowing into the system. In this second example implementation, the ampoule valve 114/116 may open before the process chamber valve 122 opens and it may open for a time period equal to, or substantially equal to, that of an adsorption time 760. The ampoule valve 114/116 may close at about a third time point 756 which may be after the process chamber valve 122 opens (which is different than in the first example implementation) at about a second time point 754. In some such implementations, the ampoule valve 114/116 may remain open after the precursor reaches and enters the process chamber 128 such that the ampoule valve 114/116 and the chamber valve 122 are both open together for some period of time.

At about the second time point 754 in FIG. 7, the dose step begins. This second time point 754 may occur after the first time point 752 by an amount of time that may be equal, or substantially equal, to a line charge time 762. As can be seen in FIG. 7, the gas line section may be fully charged with precursor, e.g. the gas line section from about the ampoule 104 to about the process chamber 128 may contain precursor, at about this second time point 754. The process chamber valve 122 also opens at, or about, the second time point 754 which may be about when the precursor arrives at the process chamber valve 122.

Figure 8:
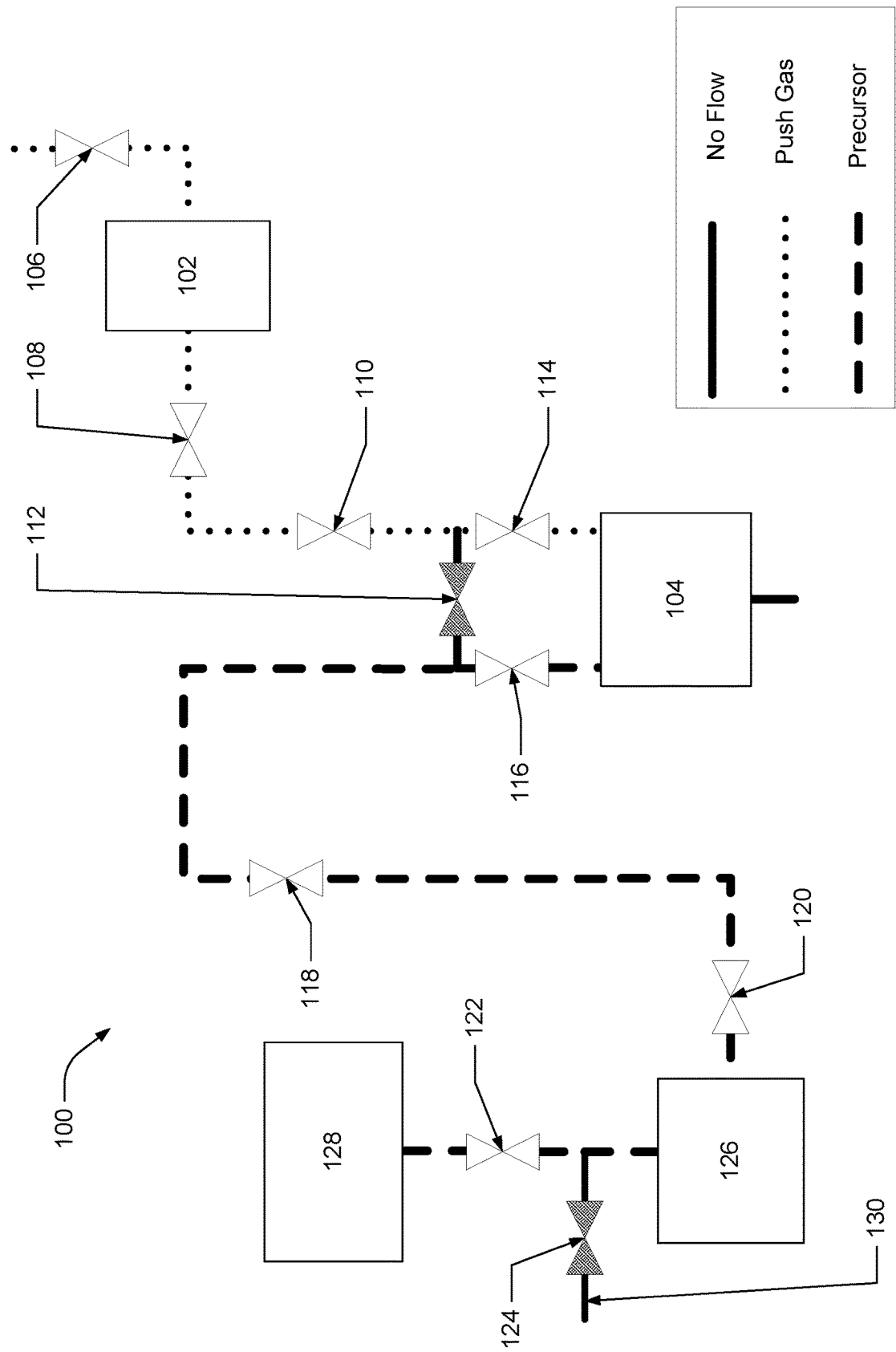
FIG. 8 depicts the precursor delivery system of the second example implementation at the beginning of the dose step.

FIG. 8 depicts the precursor delivery system of the second example implementation at the beginning of the dose step. FIG. 8 depicts this system at about the second time point 754 of FIG. 7. As can be seen, the bypass valve 112 is closed, precursor is flowing from the ampoule 104 through the open process chamber valve 122 and into the process chamber 128.

Referring back to FIG. 7, between about the second time point 754 and about a third time point 756, the process chamber valve 122 and the ampoule valve 114/116 are both open. As stated above, at the third time point 756, the ampoule valve 114/116 may close while the process chamber valve 122 may remain open, and this closure of ampoule valve 114/116 may occur after the ampoule valve 114/116 opened, i.e. at about the first time point 752, by an amount equal, or substantially, equal to the adsorption time 760. As can be seen further in FIG. 7, the third time point 756 may occur before the process chamber valve 122 closes by an amount equal, or substantially equal, to the line charge time 762.

Figure 9:
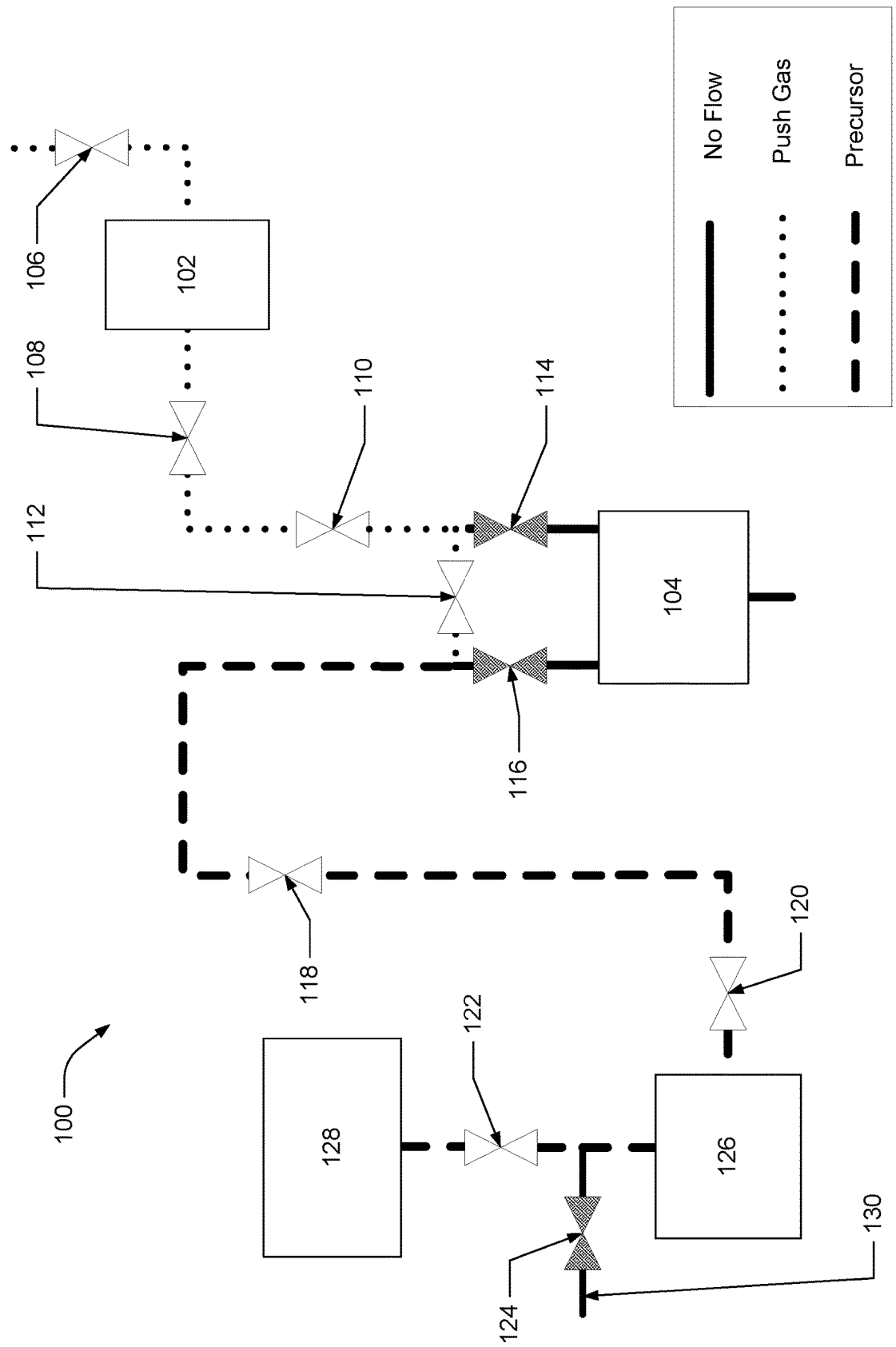
FIG. 9 depicts the precursor delivery system of the second example implementation at the close of the ampoule valve.

FIG. 9 depicts the precursor delivery system of the second example implementation at the close of the ampoule valve. FIG. 9 depicts this system at about the third time point 756 of FIG. 7. As can be seen, the ampoule valve 114/116 is closed while the bypass valve 112 is open.

At about a fourth time point 758 of FIG. 7, the process chamber valve 122 closes and the foreline valve 124 opens. As stated above, because the ampoule valve 114/116 may close before the process chamber valve 122 closes by an amount equal, or substantially equal, to the line charge time 762, the gas line section may contain little to no precursor at the fourth time point 758 when the process chamber valve 122 closes.

Figure 10:
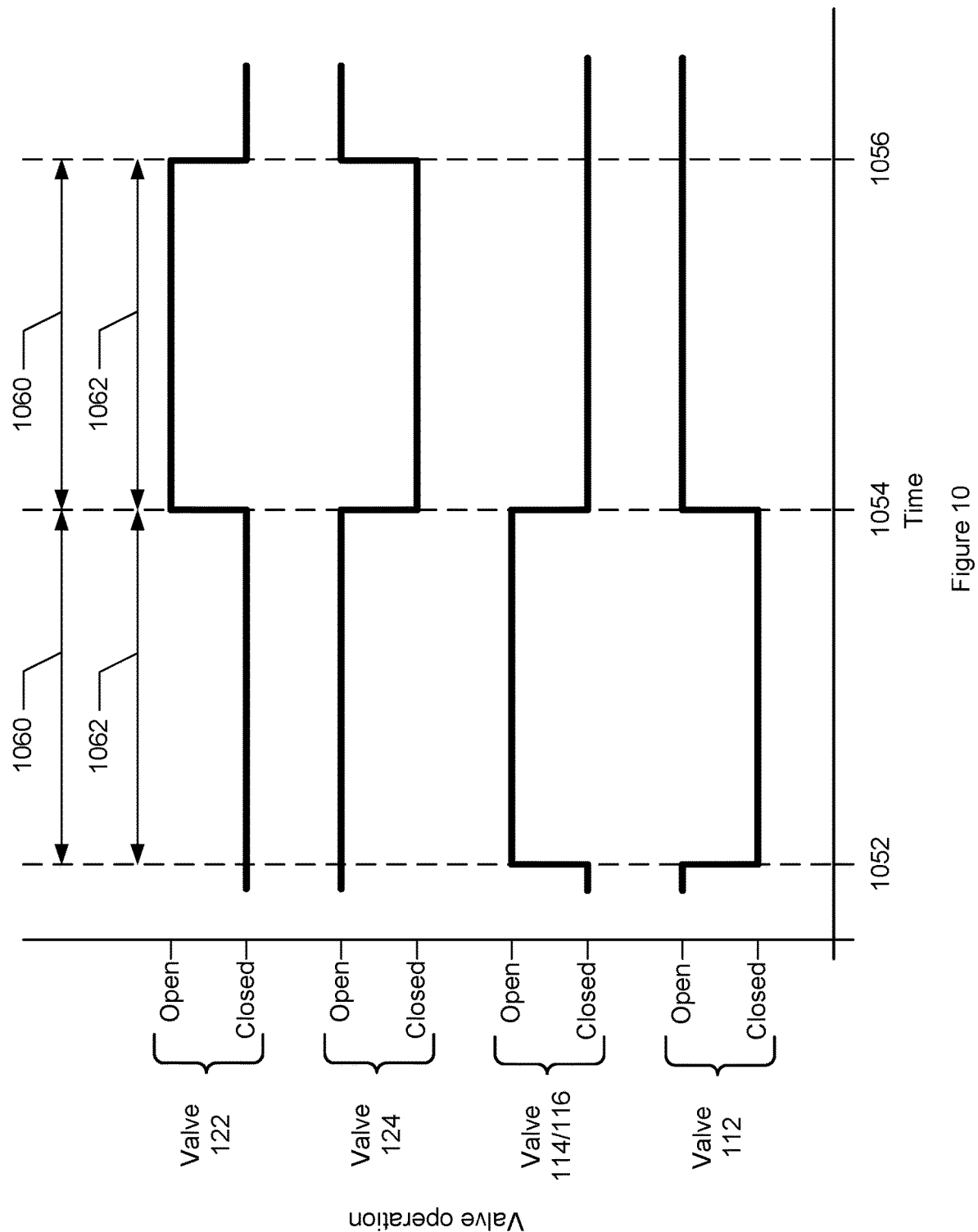
FIG. 10 depicts a graphical representation of valve operation and timing for the third example implementation of a precursory delivery system when the adsorption time may be equal to the line charge time.

In a third example implementation, the adsorption time may be equal to the line charge time. FIG. 10 depicts a graphical representation of valve operation and timing for the third example implementation of a precursory delivery system when the adsorption time may be equal to the line charge time. Similar to the charts in FIGS. 4 and 7, time is on the x-axis and progresses from left to right, and the y-axis contains valve operation, i.e. either "open" or "closed" for the same four valves, which include the process chamber valve 122, the foreline valve 124, the ampoule valve 114/116, and the bypass valve 112. As can be seen, before any precursor is loaded into the system, i.e. before a first time point 1052, the process chamber valve 122 is closed, the foreline valve 124 is open, the ampoule valve 114/116 is closed, and the bypass valve is open, which may allow the push gas to flow from, among other items, the flow controller 102, through the bypass valve 112 and not into the ampoule 104, into the mixing assembly 126, and through the foreline 130.

At a first time point 1052 in FIG. 10, the ampoule valve 114/116 may open and the bypass valve 112 may close, thereby allowing push gas to flow into the ampoule 104 and cause precursor to begin flowing into the system. In this third example implementation, the ampoule valve 114/116 may open before the process chamber valve 122 opens and it may open for a time period equal to, or substantially equal to, that of an adsorption time 1060 which may be the same as a line charge time 1062. FIG. 10 illustrates this: the ampoule valve 114/116 is open for an amount of time equal, or substantially equal, to the adsorption time 1060 which is equal, or substantially equal, to the line charge time 1062.

Figure 11:
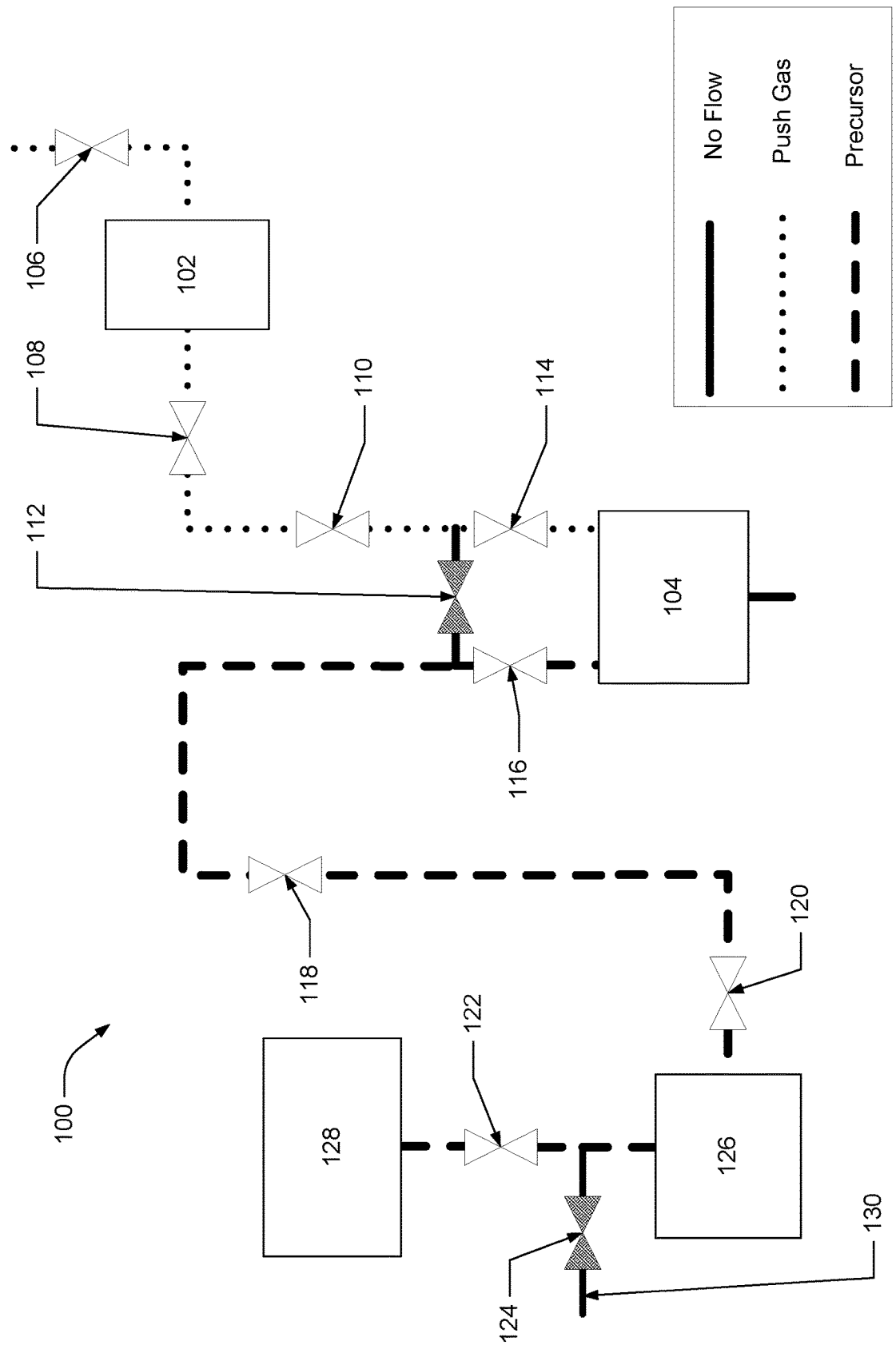
FIG. 11 depicts the precursor delivery system of the third example implementation at the beginning of the dose step.

Two events occur at or about the second time point 1054. As mentioned above, the ampoule valve 114/116 may close at or about the second time point 1054 and the chamber valve 122 may open at or about the second time point 1054. FIG. 11 depicts the precursor delivery system of the third example implementation at the beginning of the dose step. FIG. 11 depicts this system at about the second time point 1054 of FIG. 10. As can be seen, the bypass valve 112 is closed and precursor is flowing from the ampoule 104 through the open process chamber valve 122 and into the process chamber 128.

Figure 12:
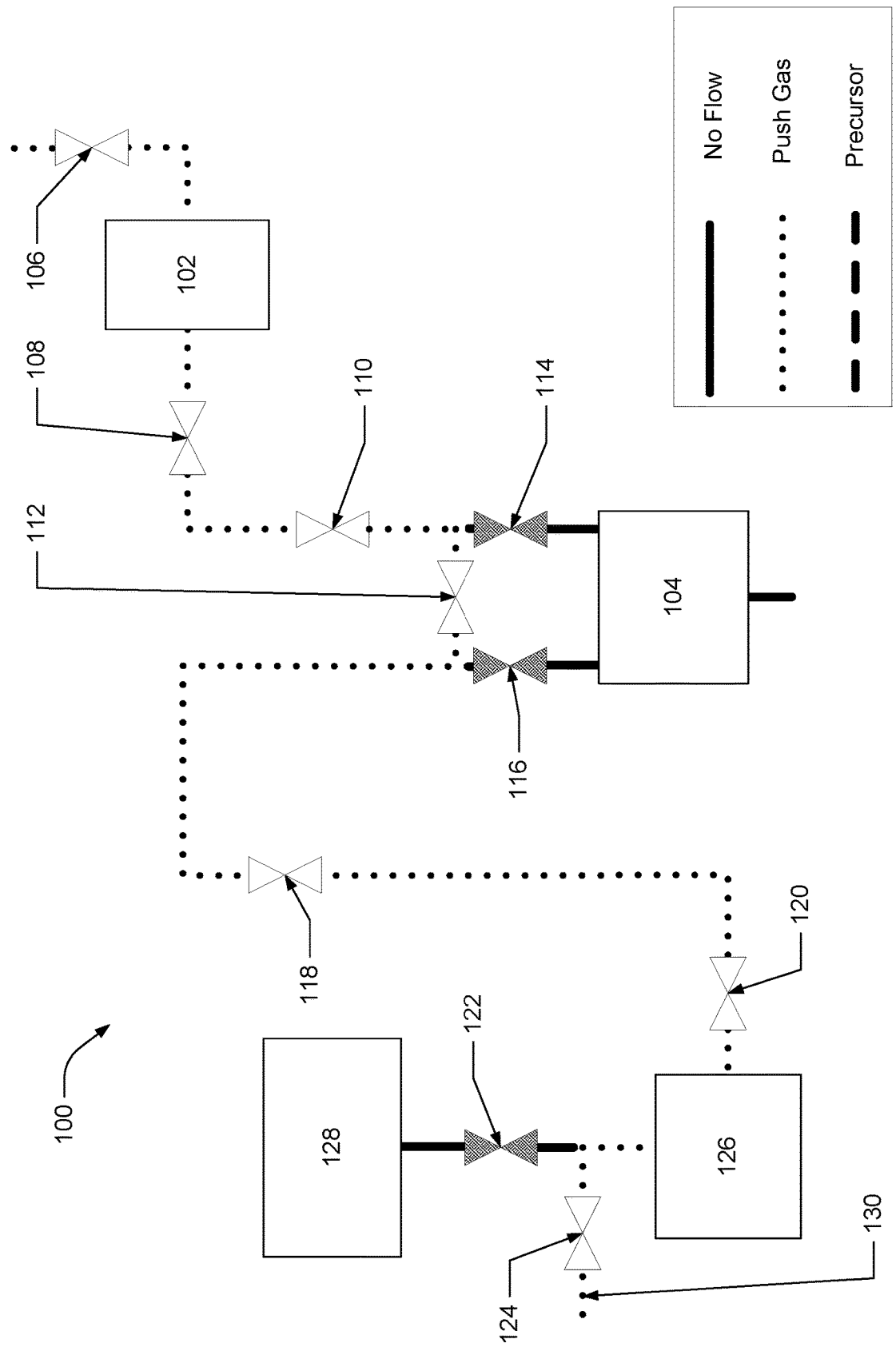
FIG. 12 depicts the precursor delivery system of the third example implementation at the end of the dose step.

Similar to the ampoule valve 114/116, the chamber valve 122 may remain open for an amount of time equal, or substantially equal, to the adsorption time 1060 and the line charge time 1062, which are equal to each other. Also, the chamber valve 122 may close at about a third time period 1056. In such implementations, the gas line section gets fully charged before the beginning of the dose step at about the second time point 1054. FIG. 12 depicts the precursor delivery system of the third example implementation at the end of the dose step. FIG. 12 depicts this system at about the third time point 1056 of FIG. 10. As can be seen, the bypass valve 112 is open, the ampoule valve 114/116 is closed, the process chamber valve 122 is closed, and the foreline valve 124 is open such that push gas is flowing through the system and through the foreline 130. At the end of this dose step, e.g. at time 1056, all or substantially all precursor is drained from the gas line section.

In this third example implementation, the first time point 1052 may be considered the beginning of the precursor loading into the system, the second time point 1054 may be considered both the end of the precursor loading and the beginning of the dose step, and the third time point 1056 may be considered the end of the dose step.

In all such implementations, push gas may flow continuously. This continuous flow may ensure a continuous flow of precursor as well as continuous purging of the gas line. When the ampoule valve 114/116 is closed, the push gas may be diverted around the ampoule through bypass valve 112 such that the push gas continues flowing towards the process chamber 128.

In some implementations, the gas line section may drained of substantially all precursor at the end of the dose step, while in some implementations, some precursor may remain within the gas line section.

In some implementations, the duration of time which the ampoule valve 114/116 may be opened may be more or less than the saturation time and/or the adsorption time.

As discussed above, in some implementations the timing of the valve operations may be set using line charge time, adsorption time, or some other time. Moreover, the frame of reference for the operation of the valves may be the start of a dose step, the stop of a dose step, any other event during a dose step, and/or any event during an ALD cycle.

In some implementations, including the three example implementations discussed above, an amount of precursor may be sent through the gas line that may be more than necessary for a desired adsorption amount. This additional precursor may also be sent such that it arrives before the beginning of the dose step, after the dose step, and/or after the desired adsorption/saturation has been achieved. In some such implementations, some precursor may be dumped to the foreline before and/or after the dose step. In some such implementations, the duration of time for which the ampoule valve may be open, the timing of when the ampoule valve may open and/or close, the duration of time for which the chamber valve may be open, and/or the timing of when the chamber valve may be open may not be the same as discussed hereinabove, including in FIGS. 4 to 12. However, to reduce waste, the excess precursor may be limited to about 20% or less (or about 10% or less) of the amount required for adsorption/saturation.

Furthermore, in some implementations, each event (e.g., the opening of the ampoule valve, the closing of the chamber valve) may not occur precisely at the intended time point. Additionally, the location of the precursor at the each time point may not be as precise as discussed above. In some instances the phrase "substantially" has been used with regard to at least timing and amounts, and this term may mean within +/−15% of the referenced item (e.g. time or amount). For example, if an adsorption time is 0.1 seconds, then a time substantially equal to the adsorption time may be between about 0.09 seconds and about 0.11 seconds.

Moreover, the timing of the valves may not be exactly equal to the line charge time and/or adsorption time. There may also be a timing delay to account for delays of the system, such as the time it takes a valve to open or close. In some embodiments, an ALD valve may be used which may have a timing delay of 25 milliseconds. There may also be a margin of error within the implementations herein which may also be 25 milliseconds.

Additionally, the timing of when the ampoule valve opens and/or its duration of opening may not be constant for each process cycle, such as an ALD cycle. In some implementations, a dynamic feedback loop may be created in order to deliver exactly the same number of moles of precursor per cycle desired for each cycle, which may be below, equal to, or greater than the adsorption amount. The amount of precursor delivered in a flow-over-vapor system, such as described herein, may depend on several factors including ampoule temperature, headspace pressure, and push gas flow. If one or more of these parameters deviates from the intended set points over the course of the deposition period (for example, due to precursor level changing in the ampoule), the amount of delivered precursor per ampoule valve open time will deviate accordingly. A feedback loop may be created by, among other things, sensor data (e.g. measurements) from, for instance, ampoule thermocouples, pressure gauges, and MFC's, and a controller. In one example, a pressure gauge (e.g., a manometer) is located at the entrance to the process chamber (e.g., by valve 122). The arrival of precursor at the process chamber may be signaled by a pressure variation detected by the pressure gauge. By dynamically controlling the ampoule open/close timing based on such feedback loop, precursor delivery can be made more robust and repeatable cycle-to-cycle. The feedback loop, measurements, and/or adjustments may be made during a dose/deposition step, between steps in a cycle, between cycles, and/or between processes.

As mentioned above, before one or more processing cycles, a measurement and/or calibration step, for instance that described above and shown in FIG. 3, may be performed in order to determine the adsorption time and/or line charge time. Such a determination may be made similar to that described above, e.g. based upon sensor or monitoring equipment that may detect one or more factors affecting precursor delivery and/or process parameters, and/or an experimental step, for instance like that discussed above. The information gathered may be used to make adjustments or changes to the timing of when the ampoule valve is opened and/or the duration of such opening, e.g. when it closes. This may occur between dose steps, during a dose step, between cycles, or between processes.

The methods, embodiments, and implementations discussed herein provide numerous improvements and benefits to semiconductor processing. Some important goals for semiconductor processing may include, for instance, increasing wafer throughput, reducing material, including precursor, waste/usage, and increasing or maintaining wafer uniformity. For example, FIG. 13 depicts some demonstrative data indicating that using the implementations discussed herein may, in at least some circumstances, lead to a reduction of precursor usage. As can be seen, the results in the right hand column, labeled "Chemical Usage", of the chart show precursor reduction from 0.323 grams/wafer to 0.225 grams/wafer. The top row indicates the data shown in the middle and bottom row. The middle row, labeled "Typical Process", shows the chemical usage for a particular semiconductor process using typical general precursor dosing sequence while the bottom row, labeled "New Process", shows the chemical usage of the same semiconductor process but with precursor delivery according to, at least in part, the implementations discussed herein. The bottom row shows that for the same dose time of 0.15 seconds, the ampoule valve 114/116 open time was reduced from 0.3 seconds to 0.2 seconds without adverse impact on deposition rate and film uniformity. The depR and NU % (R/2) (half-range non-unifomity) improved using the new process, which may be because of a longer ampoule valve 114/116 close time which led to improved precursor refresh rate in the ampoule 104. The shorter ampoule valve 114/116 open time led to reduced precursor consumption. The new process reduces precursor wastage.

Some other advantages of the present invention include, but are not limited to, reduced precursor waste; reduced wafer defectivity, which may be caused by the elimination of stagnant gas line volume, by having a fully purged gas line section that may be due to the constantly flowing push gas, and/or by the elimination of chamber valve operation in the presence of precursor; and/or reduction of dose time and/or a dose step thereby increasing throughput.

In some implementations, a controller is part of a system, which may be part of the examples described herein. The controller may include "logic" such as ampoule valve(s) opening and closing logic, as described above, or other control logic discussed herein. The logic may be implemented as software (with or without associated hardware for executing software instructions), hardware designed or configured to carry out certain operations, and combinations thereof. Such systems may comprise semiconductor processing equipment, including a processing tool or tools, processing chamber or chambers, a platform or platforms for processing, and/or specific processing components including, but not limited to, a wafer pedestal, a gas flow system, a precursor delivery system, gas lines, plumbing, valves, an ampoule, etc. These systems may be integrated with electronics (e.g., the logic) for controlling their operation before, during, and after processing of a semiconductor wafer or substrate. The electronics (or logic) may be referred to as the "controller," which may control various components or subparts of the system or systems, including, but not limited to the valves which may be configured to control the flow of fluid through one or more parts of the system(s), which may include through the gas lines, ampoule, plumbing, and/or process chamber.

The controller, depending on the processing requirements and/or the type of system, may be programmed, designed, and/or configured to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, refilling of ampoules, wafer transfers into and out of a tool and other transfer tools, flow of fluid (e.g. precursor or push gas) through the gas lines, ampoule, mixing assembly, and/or process chamber, and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components (e.g. a precursor delivery system), cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 14:
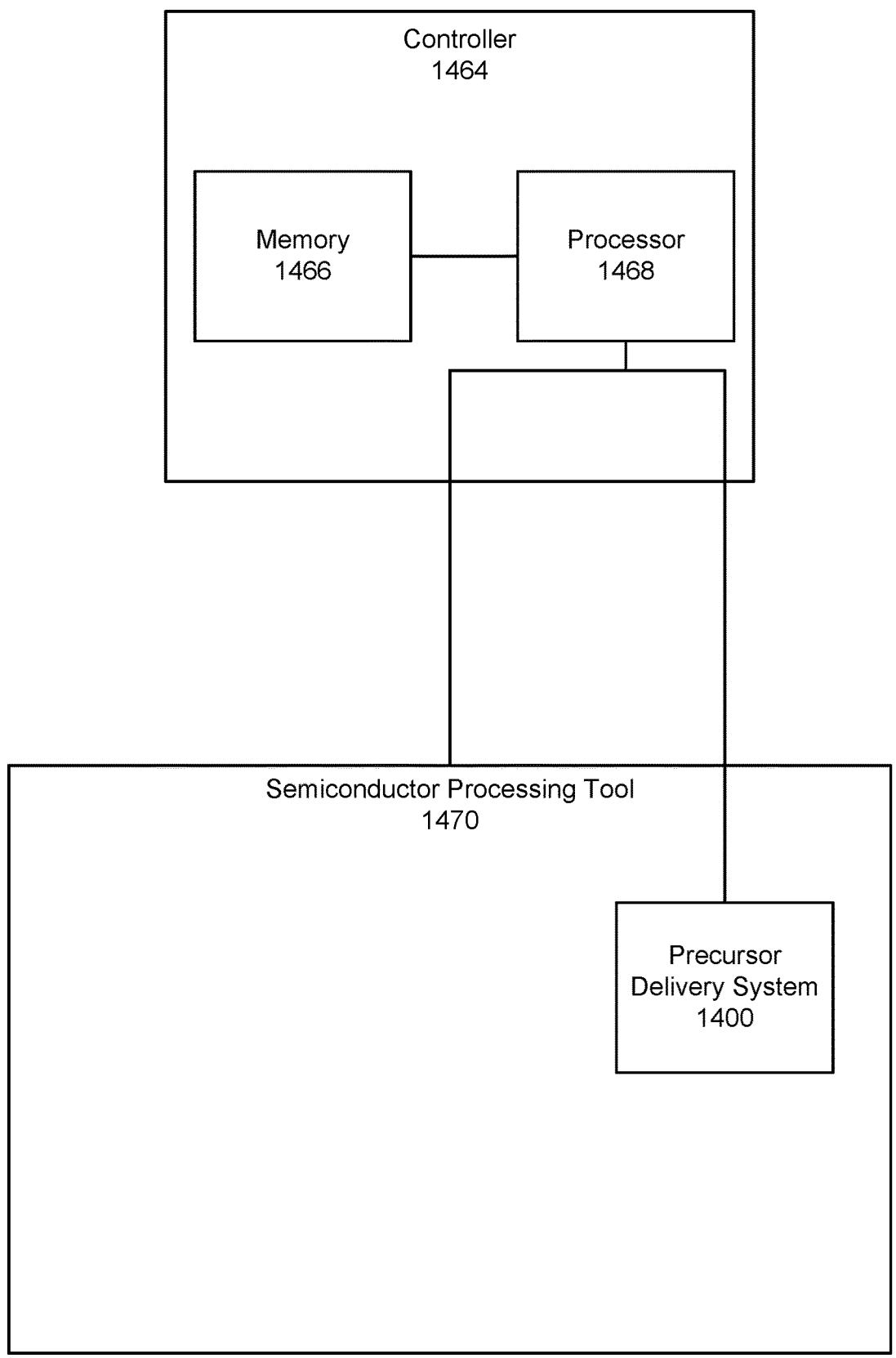
FIG. 14 depicts an example controller for a semiconductor processing tool that includes a precursor delivery system.

In some implementations, the controller may have at least a memory and one or more processors, and the memory may contain instructions for executing the functions necessary to operating the implementations discussed herein. In other implementations, the controller contains a specially designed processor, which may or may not act under the control of software instructions. The controller may be configured to control one or more aspects of the precursor delivery system and/or a semiconductor processing tool that may contain a semiconductor processing system. FIG. 14 depicts an example controller for a semiconductor processing tool that includes a precursor delivery system. As can be seen, the controller 1464 includes a memory 1466 and a processor 1468, and the processor is communicatively connected to a semiconductor processing tool 1470 and a precursor delivery system 1400 (which is part of the semiconductor processing tool 1470). As stated before, the memory 1466 may contain instructions for, among other things, controlling the precursor delivery system 1400, for instance, the memory 1466 may include instructions for controlling one or more ampoule valves, the ampoule, one or more process chamber valves, one or more foreline valves, and any other aspect of the precursor delivery system, including, but not limited to the flow of precursor and/or push gas through the system.

As described above, in some implementations a system for precursor delivery may include one or more of the above components including, but not limited to, an ampoule configured to contain precursor and to be a component of a substrate processing apparatus (e.g. a semiconductor processing tool), a flow controller, plumbing (e.g. gas lines, valves, restrictors) that may fluidically connect the ampoule, flow controller, mixing assembly, and process chamber and be configured to control fluid flow through such a system. A controller may also be part of this system and may be configured to control one or more aspects of the system, including but not limited to the precursor delivery system, as described above.

Unless the context of this disclosure clearly requires otherwise, throughout the description and the embodiments, the words "comprise," "comprising," and the like are to be construed in an inclusive sense as opposed to an exclusive or exhaustive sense; that is to say, in a sense of "including, but not limited to." Words using the singular or plural number also generally include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list, and any combination of the items in the list. The term "implementation" refers to implementations of techniques and methods described herein, as well as to physical objects that embody the structures and/or incorporate the techniques and/or methods described herein.

There are many concepts and implementations described and illustrated herein. While certain features, attributes and advantages of the implementations discussed herein have been described and illustrated, it should be understood that many others, as well as different and/or similar implementations, features, attributes and advantages of the present disclosure, are apparent from the description and illustrations. As such, the above implementations are merely exemplary. They are not intended to be exhaustive or to limit the disclosure to the precise forms, techniques, materials and/or configurations disclosed. Many modifications and variations are possible in light of this disclosure. It is to be understood that other implementations may be utilized and operational changes may be made without departing from the scope of the present disclosure. As such, the scope of the disclosure is not limited solely to the description above because the description of the above implementations has been presented for the purposes of illustration and description.

Importantly, the present disclosure is neither limited to any single aspect nor implementation, nor to any single combination and/or permutation of such aspects and/or implementations. Moreover, each of the aspects of the present disclosure, and/or implementations thereof, may be employed alone or in combination with one or more of the other aspects and/or implementations thereof. For the sake of brevity, many of those permutations and combinations will not be discussed and/or illustrated separately herein.

None of the pending claims include limitations presented in "means plus function" or "step plus function" form. (See, 35 USC § 112(f)). It is Applicant's intent that none of the claim limitations be interpreted under or in accordance with 35 U.S.C. § 112(f).

What is claimed is:

1. A method for controlling precursor delivery in a semiconductor processing tool, the method comprising:
   (a) starting a flow of a precursor from a precursor source to a process chamber before a dose step by an amount of time that is substantially equal to a line charge time, wherein the line charge time is the time required for precursor to flow from the precursor source to the process chamber;
   (b) stopping the precursor from flowing out of the precursor source;
   (c) opening a process chamber valve, at the beginning of the dose step, to allow the flow of precursor to enter the process chamber; and
   (d) closing the process chamber valve, at the end of the dose step, to stop the flow of precursor from entering the process chamber,
   wherein, prior to (a), a gas flows through a gas line without the presence of the precursor, and wherein, during (a), the gas flows to cause the precursor to move through the gas line to the processing chamber.

2. The method of claim 1, wherein the precursor is in a liquid state.

3. The method of claim 1, wherein the precursor is in a vapor state.

4. The method of claim 1, wherein the gas comprises one or more of:
   an inert gas or a non-inert gas.

5. The method of claim 1, wherein the precursor comprises one or more materials for depositing a layer of a metal, an oxide, silicon, and a silicon dioxide.

6. A method for controlling precursor flow in a semiconductor processing tool, the method comprising:
   (a) prior to (b), flowing gas through a gas line;
   (b) opening one or more valves of an ampoule, before a process step during which precursor is delivered to a wafer in a process chamber by an amount of time that is substantially equal to a line charge time, to start a flow of precursor from the ampoule to the process chamber through the gas line, wherein the line charge time is the time required for precursor to flow from the ampoule to the process chamber;
   (c) closing the one or more valves of the ampoule to stop the precursor from flowing out of the ampoule;
   (d) opening a process chamber valve, at the beginning of the process step during which precursor is delivered to the wafer in the process chamber, to allow the flow of precursor to enter the process chamber; and
   (e) closing the process chamber valve, at the end of the process step during which precursor is delivered to the wafer in the process chamber, to stop the flow of precursor from entering the process chamber,
   wherein, during (b), the gas flows to cause the precursor to move through the gas line to the processing chamber.

7. The method of claim 6, wherein the process step comprises adsorption of the precursor on the wafer.

8. The method of claim 6, wherein the process step comprises conversion of the precursor to a film or layer.

9. The method of claim 8, wherein the process step further comprises using a plasma to activate a reaction of the precursor.

10. The method of claim 8, wherein:
    the process step further comprises flowing a second process gas to the process chamber, and
    the second process gas causes activation of a reaction of the precursor.

* * * * *